(12) United States Patent
Tanabe et al.

(10) Patent No.: US 11,604,484 B2
(45) Date of Patent: Mar. 14, 2023

(54) ELECTRONIC SYSTEM DEVICE AND METHOD OF STARTING THE SAME

(71) Applicant: RENESAS ELECTRONICS CORPORATION, Tokyo (JP)

(72) Inventors: Akira Tanabe, Tokyo (JP); Kazuya Uejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 211 days.

(21) Appl. No.: 17/068,476

(22) Filed: Oct. 12, 2020

(65) Prior Publication Data
US 2021/0116951 A1    Apr. 22, 2021

(30) Foreign Application Priority Data

Oct. 21, 2019 (JP) .............................. JP2019-191713

(51) Int. Cl.
| | |
|---|---|
| *H03K 17/687* | (2006.01) |
| *G05F 1/44* | (2006.01) |
| *G01R 31/40* | (2020.01) |
| *H01L 27/092* | (2006.01) |
| *G04C 10/02* | (2006.01) |
| *H03K 17/00* | (2006.01) |

(52) U.S. Cl.
CPC .............. *G05F 1/44* (2013.01); *G01R 31/40* (2013.01); *G04C 10/02* (2013.01); *H01L 27/092* (2013.01); *H03K 17/00* (2013.01)

(58) Field of Classification Search
CPC ........ G04C 10/00; G04C 10/02; G11C 5/146; G05F 1/44; H01L 27/092; H01L 27/0928; H01L 27/1203; H02J 7/35; H03K 17/00; H03K 17/51; H03K 17/56; H03K 17/687; H03K 17/6871; H03K 17/6872
See application file for complete search history.

(56) References Cited

U.S. PATENT DOCUMENTS

2020/0321861 A1* 10/2020 Hashimoto ............. H02M 1/36

FOREIGN PATENT DOCUMENTS

JP          08-036070 A      2/1996

* cited by examiner

*Primary Examiner* — Long Nguyen
(74) *Attorney, Agent, or Firm* — McDermott Will & Emery LLP

(57) ABSTRACT

An electronic system device comprises a power generation device generating a power supply voltage, a substrate bias generation circuit connected to the power generation device, a memory circuit, a monitor circuit, and a capacitor connected to the substrate bias generation circuit via a switch. The substrate bias generation circuit generates a substrate bias voltage from the power supply voltage and supplies charges based on the substrate bias voltage to the capacitor while the switch is ON-state. While the switch is OFF-state, the capacitor stores the accumulated charges based on the substrate bias voltage. While the switch is ON-state, the substrate bias generation circuit adds based on the substrate bias voltage to charge that was held, and states the back bias voltage. The substrate bias generation circuit supplies the back bias voltage to memory circuit.

20 Claims, 9 Drawing Sheets

ELECTRONIC SYSTEM DEVICE AND METHOD OF STARTING THE SAME

CROSS-REFERENCE TO RELATED APPLICATIONS

The disclosure of Japanese Patent Application No. 2019-191713 filed on Oct. 21, 2019 including the specification, drawings and abstract is incorporated herein by reference in its entirety.

BACKGROUND

It relates to starting method of an electronic system device and the electronic system device.

Energy harvest (environmental power generation) technology is known in which power is obtained from energy such as sunlight, vibration and heat, and the electronic system device is driven based on the power. The electronic system device includes a semiconductor device and a power generation device.

There are disclosed techniques listed below.
[Patent Document 1] Japanese Unexamined Patent Application Publication No. 8-36070

Patent Document 1 discloses a solar cell clock including a solar cell, two capacitors, and a watch circuit. Patent Document 1 discloses driving the clock circuits based on charge stored in the capacitor for quick start at the time of startup.

SUMMARY

Patent Document 1 discloses, when the power consumption of the clock circuit at startup is large, the power consumption of the clock circuit may not be compensated by charge stored in the capacitor for quick start. Therefore, the solar cell clock, there is a problem that it is impossible to complete the starting operation stably. Other objects and novel features will become apparent from the description of this specification and the accompanying drawings.

According to one embodiment, the invention is as follows.

An electronic system device comprises a power generation device generating a first power supply voltage and supplying a first power supply node, a substrate bias generation circuit connected to the power generation device via the first power supply node and generating a substrate bias voltage based on the first power supply voltage, a first memory circuit connected to the power generation device via the first power supply node and configured with field effect transistors, a first control switch connected to the substrate bias generation circuit, a first capacitor connected to the first control switch via a second power supply node and receiving the substrate bias voltage from the substrate bias generation circuit, and a power supply monitor circuit connected to the first power supply node and controlling the first control switch based on voltage of the first power supply node. While the power supply monitor circuit is setting the first control switch to ON-state, the substrate bias generation circuit stores charges based on the substrate bias voltage to the first capacitor. The first capacitor retains the accumulated charges, while the power supply monitor circuit is setting the first control switch to OFF-state. While the power supply monitor circuit is setting the first control switch to ON-state, the substrate bias generation circuit added the charges based on the substrate bias voltage to charge that has been held to obtain a back bias voltage by the poured charge. And the substrate bias generation circuit supplies the back bias voltage to a well region of the field effect transistors.

According to another one embodiment, the invention is as follows.

An electronic system device comprises a power generation device generating a first power supply voltage and supplying the first power supply voltage to the first power supply node, a power switch connected to the power generation device via the first power supply node, a substrate bias generation circuit connected to the power switch via a second power supply node and generating a substrate bias voltage based on the first power supply voltage, a memory circuit connected to the second power supply node and configured with SOTB transistors, a control switch connected to the substrate bias generation circuit, a first capacitor connected to the first control switch via a third power supply node and receiving the substrate bias voltage from the substrate bias generation circuit, a first power supply monitor circuit connected to the first power supply node and controlling the power switch based on voltage of the first power supply node, and a second power supply monitor circuit connected to the second power supply node, and controlling the control switch based on the voltage of second power supply node. While the second power supply monitor circuit is setting the control switch to ON-state, the substrate bias generation circuit accumulates charges to the first capacitor based on the substrate bias voltage. While the second power supply monitor circuit is setting the control switch to OFF-state, the first capacitor holds the accumulated charges. While the second power supply monitor circuit is setting the control switch to ON-state, the held charges are poured with the charges based on the substrate bias voltage to obtain a back bias voltage by the poured charges, wherein the substrate bias generation circuit supplies the back bias voltage to a well region of the SOTB transistors.

According to another one embodiment, the invention is as follows.

A starting method of electronic system device comprises a power generation device generating a first power supply voltage and supplying the first power supply voltage to the first power supply node, a substrate bias generation circuit connected to the power generation device via the first power supply node and generating an first substrate bias voltage based on the first power supply voltage, a memory circuit connected to the power generation device via the first power supply node and including n-type SOTB transistors, a first control switch connected to the substrate bias generation circuit, a first capacitor connected to the first control switch via a second power supply node and receiving the first substrate bias voltage from the substrate bias generation circuit, and a power supply monitor circuit connected to the first power supply node and controlling the first control switch based on the first power supply node voltages. The starting method of electronic system device comprises step (a), which is accumulating charges based on first substrate bias voltage to first capacitor by the substrate bias generation circuit, while the power supply monitor circuit is setting the first control switch to ON-state. The starting method of electronic system device comprises step (b), after step (a), which is storing the charges accumulated by step (a) in the first capacitor, while the power supply monitor circuit sets the first control switch to OFF-state. The starting method of electronic system device comprises step (c) after step (b), which is pouring and adding the charges based on the first substrate bias voltage to the charges held by step (b) in the substrate bias generation circuit, and obtaining a first back bias voltage based on the poured charge, while the power supply monitor circuit is setting the first control switch to ON-state. The starting method of electronic system device comprises step (d), which is supplying the first back bias voltage to a well region of the n-type SOTB transistors by the substrate bias generation circuit.

According to the embodiment, it is possible to provide starting method of electronic system device and electronic system device for stably completing the starting operation.

DETAILED DESCRIPTION

In the following embodiments, when required for convenience, the description will be made by dividing into a plurality of sections or embodiments, but except when specifically stated, they are not independent of each other, and one is related to the modified example, some or all of the other, applications, detailed description, supplementary description, and the like. In the following embodiments, the number of component, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, the constituent elements (including the operation step and the like) are not necessarily essential except when specifically stated and when it is considered to be obviously essential in principle. Similarly, in the following embodiments, when referring to the shape, positional relationship, etc. of a component, it shall have a substantially similar shape, etc., except when specifically indicated or when it is considered that in principle it is not obvious.

First Embodiment

Figure 1:
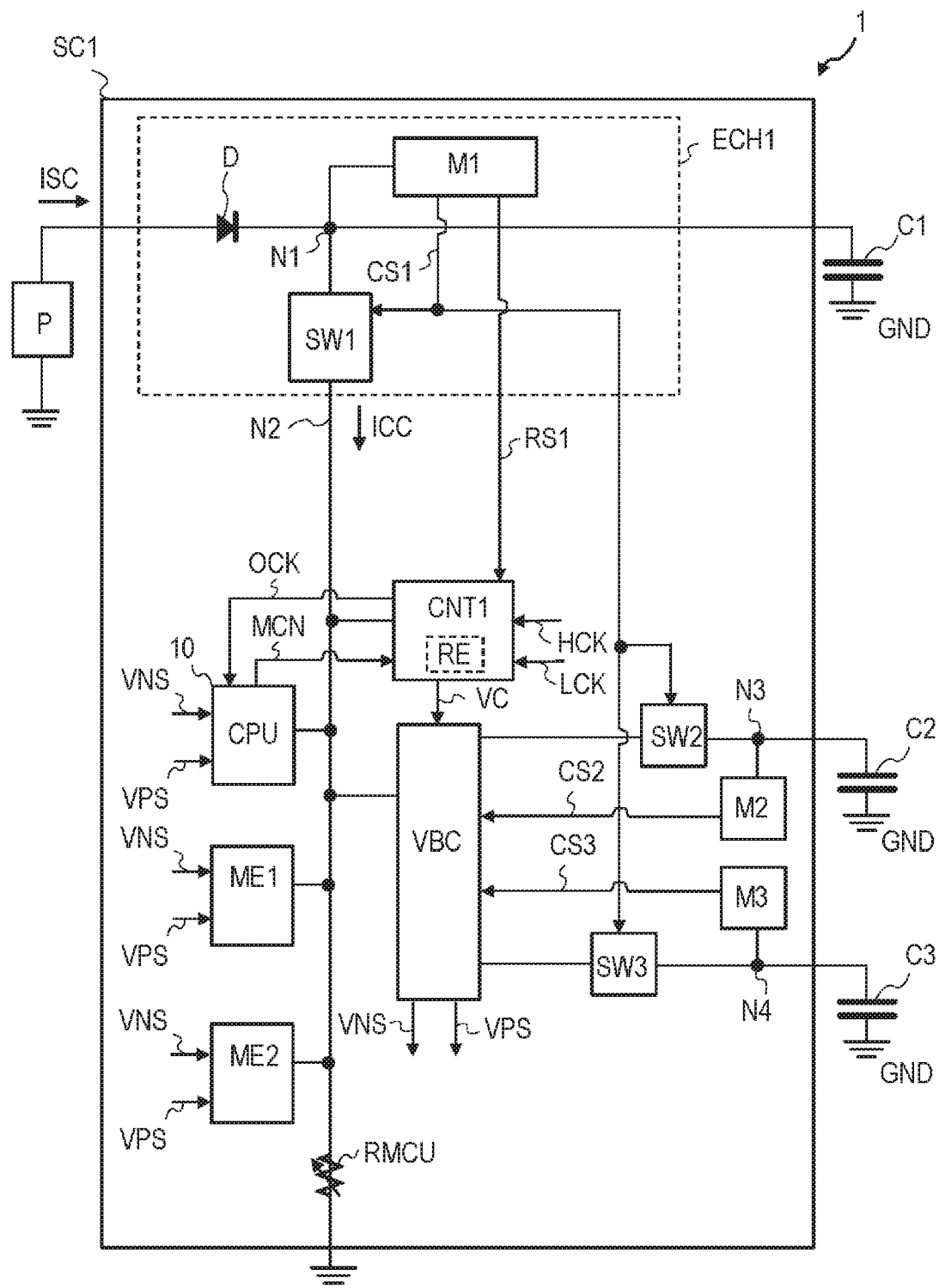
FIG. 1 is a block diagram illustrating an exemplary configuration of an electronic system device according to first embodiment.

FIG. 1 is a block diagram illustrating an exemplary configuration of the electronic system device 1 according to first embodiment.

The electronic system device 1 comprises a power generation device P, a semiconductor device SC1, a capacitor (second capacitor) C1, a capacitor (first capacitor) C2, and a capacitor (the first capacitor and the second capacitor) C3. The electronic system device 1 is used, for example, in a wristwatch.

The electronic system device 1 is driven based on the energy harvest technique. The capacitors C1, C2, and C3 are not limited to capacitor and may be capacitors. In FIG. 1, the capacitors C1, C2, and C3 are formed outside the semiconductor device SC1, but may be formed inside the semiconductor device SC1.

The semiconductor device SC1 includes a power supply circuit ECH1, a central processing unit (hereinafter referred to as CPU) 10, a memory circuit (first memory circuit) ME1, a memory circuit (second memory circuit) ME2, a control circuit CNT1, a substrate bias generation circuit VBC, a switch (Control switch) SW2, a switch (Control switch) SW3, a monitor circuit (substrate bias monitor circuit) M2, and a monitor circuit (substrate bias monitor circuit) M3. The power supply circuit ECH1 has a diode D, a monitor circuit (power supply monitor circuit) M1, and a switch (power switch) SW1. The power supply circuit ECH1 supplies the operating power to the CPU 10, the memory circuits ME1 and ME2, the control circuit CNT1, and the substrate bias generation circuit VBC.

Further, the semiconductor device SC1 has a low-speed mode (first mode) operating at a low speed, a high-speed mode (second mode) in which the semiconductor device SC1 operates at a higher speed than the low-speed mode, and a standby mode (third mode) in which certain circuit blocks in the CPU 10 are sleep state. In other words, when the semiconductor device SC1 operates in low-speed mode or standby mode, the electronic system device 1 operates as low-consumption mode. On the other hand, when the semiconductor device SC1 operates in high-speed mode, the electronic system device 1 operates as normal operation mode.

The power supply circuit ECH1, the CPU 10, the memory circuit ME1, the memory circuit ME2, the control circuit CNT1, and the substrate bias generation circuit VBC consist of plurality of field effect transistors. The field effect transistor is, for example, SOTB (Silicon on Thin Buried Oxide) transistor or MOS (Metal Oxide Semiconductor) transistor. The SOTB transistor means a transistor using a substrate in which a thin insulating film and a thin silicon film are formed on a silicon substrate. MOS transistors are distinguished from the SOTB transistors and are called bulk transistors. A p-type field effect transistor includes a p-type SOTB transistor and a p-type MOS transistor. A n-type field effect transistor includes a n-type MOS SOTB transistor and a n-type MOS transistor.

Specifically, the CPU 10, the memory circuit ME1, and the memory circuit ME2 are composed of the SOTB transistors, and the substrate bias generation circuit VBC and the control circuit CNT1 are composed of MOS transistors. The CPU 10, the memory circuit ME1, and the memory circuit ME2 may be formed of MOS transistors. Further, other circuitry may be constructed of the SOTB transistors.

The power generation device P generates a power supply voltage (a first power supply voltage) VSC and supplies the power supply voltage VSC to the semiconductor device SC1. The generating current ISC supplied from the power generation device P is, for example, 5 µA. The power generation device P shown in FIG. 1 is a solar-cell cell. However, the power generation device P is not limited to a solar cell, and may be a small power source capable of supplying only small power, such as a thermocouple, an antenna for receiving weak radio waves. The electronic system device 1 starts using the Energy Harvest technique.

The power generation device P is connected to the diode D and supplies the power supply voltage VSC to a power supply node (a first power supply node) N1 via the diode D. The diode D is a diode for preventing backflow.

The monitor circuit M1 is connected to the power generation device P via the power supply node N1 and the diode D. The switch SW1 via the power supply node N1 and the diode D, is connected to the power generation device P. The capacitor C1 is connected to the power generation device P via the power supply node N1 and the diode D. The capacitor C1 is disposed between the power supply node N1 and the ground GND. That is, each of the monitor circuit M1, the switch SW1, and the capacitor C1 is connected to the power supply node N1 in parallel.

Charges outputted by the power generation device P are stored in the capacitor C1 via the diode D and the power supply node N1. In other words, the power supply voltage VSC generated by the power generation device P is charged to the capacitor C1. As a result, the capacitor C1 obtains the power supply voltage VSC as the power supply voltage VCC-EH.

The monitor circuit M1 monitors the voltage of the power supply node N1 and controls the switches SW1, SW2 and SW3, and the control circuit CNT1 based on the voltage of the power supply node N1. Further, the monitor circuit M1, as a threshold voltage, has a threshold voltage (a second threshold voltage) Vst and a threshold voltage (a third threshold voltage) Vre. The value of the threshold voltage Vst is higher than the value of the threshold voltage Vre.

The monitor circuit M1 supplies a control signal CS1 to the switches SW1, SW2 and SW3. The switches SW1, SW2, and SW3 are set to ON-state or OFF-state according to the control signal CS1. Specifically, the monitor circuit M1 outputs the control signal CS1 (e.g., High level control signal CS1) when the voltage of the power supply node N1 reaches the threshold voltage Vst. As a result, the switches SW1, SW2, and SW3 are set from the OFF-state to the ON-state based on the control signal CS1. The monitor circuit M1 outputs the control signal CS1 (e.g., the low-level control signal CS1) when the voltage of the power supply node N1 drops and thereby the voltage of the power supply node N1 reaches the threshold voltage Vre. As a result, the switches SW1, SW2, and SW3 are set from the ON-state to the OFF-state based on the control signal CS1.

The monitor circuit M1 supplies a reset signal RS1 to the control circuit CNT1. Specifically, the monitor circuit M1 outputs the reset signal RS1 (e.g., the low-level reset signal RS1) to the control circuit CNT1 when the voltage of the power supply node N1 drops and thereby the voltage of the power supply node N1 reaches the threshold voltage Vre. As a result, the control circuit CNT1 sets an internal register RE in the control circuit CNT1 and an internal register (not shown) of the other circuit blocks (e.g., the CPU 10, the memory circuits ME1 and ME2, and the substrate bias generation circuit VBC) of the semiconductor device SC1 to a reset state (reset operation) based on reset signal RS1. The reset state means that even if the operating power supply voltage is supplied to each circuit block, each circuit block cannot be activated.

On the other hand, in the monitor circuit M1, when the voltage of the power supply node N1 is higher than the voltage the threshold voltage Vre, the control circuit CNT1 releases the reset state of the respective circuit blocks based on the reset signal RS1 (for example, the reset signal RS1 at High level). Thus, if the operating power supply voltage is provided to each circuit block, each circuit block can be activated.

A power supply node N2 is connected to the power supply node N1 via the switch SW1. The CPU 10, the memory circuit ME1, the memory circuit ME2, the control circuit CNT1, and the substrate bias generation circuit VBC are connected to the power supply node N2. Therefore, the CPU 10, the memory circuit ME1, the memory circuit ME2, the control circuit CNT1, and the substrate bias generation circuit VBC are connected to the power generation device P and the capacitor C1 via the switch SW1 and the power supply nodes N1 and N2. When the switch SW1 is set to ON-state, the CPU 10, the memory circuit ME1, the memory circuit ME2, the control circuit CNT1, and the substrate bias generation circuit VBC receive the power supply voltage VCC_MCU based on the power supply voltage VSC and the power supply voltage VCC_EH. In other words, when the switch SW1 is set to the ON-state, the CPU 10, the memory circuit ME1, the memory circuit ME2, the control circuit CNT1, and the substrate bias generation circuit VBC receive at least the power supply voltage VSC generated by the power generation device P as the power supply voltage VCC_MCU via the switch SW1 and the power supply nodes N1 and N2. The CPU 10, the memory circuit ME1, the memory circuit ME2, the control circuit CNT1, and the substrate bias generation circuit VBC operate based on the power supply voltage VCC-MCU. Therefore, the power supply voltage VCC_MCU is the operating power supply voltage of those circuit blocks.

On the other hand, when the switch SW1 is turned off, the power supply node N1 and the power supply node N2 are shut off by the switch SW1. Therefore, the power supply voltage VSC and the power supply voltage VCC-EH are not supplied to the CPU 10, the memory circuit ME1, the memory circuit ME2, the control circuit CNT1, and the substrate bias generation circuit VBC. As a result, these circuit blocks cannot operate based on the power supply voltage VCC_MCU.

FIG. 1 shows a resistor element RMCU as a load of the semiconductor device SC1, and the resistor element RMCU is connected to the power supply node N2.

The CPU 10, the control circuit CNT1, the memory circuit ME1, and the memory circuit ME2 are connected via buses not shown in FIG.

The CPU 10 reads user program from the memory circuit ME2 via the buses, and executes a process according to the read a user program. The CPU 10 outputs an instruction signal MCN to the control circuit CNT1.

The memory circuit ME1 is, for example, a static random access memory. The CPU 10 stores primary data (e.g., process result data according to the user program) in the memory circuit ME1 via buses.

The memory circuit ME2 is an electrically rewritable nonvolatile memory such as a flash memory (FLASH), for example. The memory circuit ME2 stores the user program and an initial value. The initial value is a value (e.g., a trimmed value) indicating the initialization of the internal register described above. The user program is a program that is executed after the initial setting and created by the user. The memory circuit ME2 is connected to the outside of the semiconductor device SC1 via input/output circuits (not shown in FIG. 1). As a result, the content of the user program and the initial value can be rewritten from the outside of the semiconductor device SC1. In FIG. 1, the memory circuit ME2 is formed inside the semiconductor device SC1, but may be formed outside the semiconductor device SC1.

The control circuit CNT1 has the internal register RE. The control circuit CNT1 receives the reset signal RS1 supplied from the monitor circuit M1, the instruction signal MCN supplied from the CPU 10, and the high-speed clock signal HCK and the low-speed clock signal LCK supplied from the input/output circuits not shown in FIG. 1.

The control circuit CNT1 selects the high-speed clock signal HCK or the low-speed clock signal LCK in accordance with the instruction signal MCN, and supplies the selected signal to the CPU 10 as the operation clock signal OCK. In other words, the control circuit CNT1 designates a high-speed mode, a low-speed mode, or a standby mode by the instruction signal MCN. In the specification of the high-speed mode, the control circuit CNT1 supplies the high-speed clock signal HCK to the CPU 10 as the operation clock signal OCK. In the specification of the low-speed mode, the control circuit CNT1 supplies the low-speed clock signal LCK to the CPU 10 as the operation clock signal OCK. In the standby mode specification, the control circuit CNT1 blocks the operation clock signal OCK from being supplied to the CPU 10.

The CPU 10 operates in synchronization with the operation clock signal OCK. Therefore, when the low-speed clock signal LCK is supplied as the operation clock signal OCK, the operation speed of the CPU 10 is reduced. When the high-speed clock signal HCK is supplied as the operation clock signal OCK, the operation speed of the CPU 10 is increased.

Therefore, in the low-speed mode, the operation speed of the CPU 10 is reduced, and the power consumed in the CPU 10 can be reduced. Consequently, the power consumed in the electronic system device 1 is reduced. Further, in the standby mode, since the operation clock signal OCK is not supplied to the CPU 10, the operation clock signal OCK is sleep state in a particular circuit in the CPU 10. Consequently, the power consumed in the electronic system device 1 is reduced.

The control circuit CNT1 generates a mode specification signal VC for controlling the substrate bias generation circuit VBC in accordance with the instruction signal MCN, and supplies the mode specification signal VC to the substrate bias generation circuit VBC. The substrate bias generation circuit VBC is controlled by the mode specification signal VC.

When a specification signal MCN supports low-speed mode or standby mode, the substrate bias generation circuit VBC generates a substrate bias voltage VBN, which is a negative voltage from the power supply voltage VCC_MCU, which is the input voltage, and a substrate bias voltage VBP, which is the positive voltage, based on the mode specification signal VC. In other words, the substrate bias generation circuit VBC generates the substrate bias voltage VBN and VBP from the power supply voltage VSC supplied at least from the power generation device P.

On the other hand, when the specification signal MCN supports high-speed mode, the substrate bias generation circuit VBC does not generate the substrate bias voltage VBN and VBP from the supply voltage VCC_MCU.

The substrate bias generation circuit VBC is common charge pump circuitry. For example, if the power supply voltage VCC_MCU is defined as "VDD" and the bias variation amount is "VBB", the substrate bias voltage VBN is the voltage (−VBB) and the substrate bias voltage VBP is the voltage (VDD+VBB).

The substrate bias generation circuit VBC is connected to the capacitor C2 via the switch SW2 and a power supply node N3. Specifically, the substrate bias generation circuit VBC is connected to the switch SW2. The switch SW2 via the power supply node N3, is connected to the capacitor C2. The capacitor C2 is disposed between the power supply node N3 and the ground GND.

When the switch SW2 is set to the ON-state by the monitor circuit M1, the substrate bias generation circuit VBC supplies the substrate bias voltage VBN to the capacitor (first capacitor) C2 via the switch SW2 and the power supply node N3. In other words, the substrate bias generation circuit VBC stores the charge (negative charge) based on the substrate bias voltage VBN in the capacitor C2 via the switch SW2 and the power supply node (second power supply node) N3. Thereby, the capacitor C2 accumulates the charges and obtains the substrate bias voltage VBN. On the other hand, when the switch SW2 is turned off by the monitor circuit M1, the substrate bias voltage VBN is not supplied to the capacitor C2 via the switch SW2 and the power supply node N3.

The monitor circuit (the substrate bias monitor circuit) M2 is connected to the power supply node N3 in parallel with the capacitor C2. The monitor circuit M2 monitors the voltage of the power supply node N3 and controls the substrate bias generation circuit VBC based on the voltage of the power supply node N3. The monitor circuit M2 has a threshold voltage (a target voltage, a first threshold voltage) VbackN. The monitor circuit M2 supplies a control signal CS2 to the substrate bias generation circuit VBC when the voltage of the power supply node N3 reaches the threshold voltage VbackN. The substrate bias generation circuit VBC supplies the substrate bias voltage VBN reaching the threshold voltage VbackN as a back bias voltage VNS to the well region of the n-type field effect transistor in the CPU 10, the memory circuit ME1, and the memory circuit ME2. In other words, the substrate bias generation circuit VBC supplies the substrate bias voltage VBN reaching the threshold voltage VbackN to the well region of the n-type SOTB transistors in the CPU 10, the memory circuit ME1, and the memory circuit ME2.

The substrate bias generation circuit VBC is connected to the capacitor C3 via the switch SW3 and a power supply node N4. Specifically, the substrate bias generation circuit VBC are connected to the switch SW3. The switch SW3 via the power supply node N4, is connected to the capacitor C3. The capacitor C3 is disposed between the power supply node N4 and the ground GND.

When the switch SW3 is set to the on-state by the monitor circuit M1, the substrate bias generation circuit VBC supplies the substrate bias voltage VBP to the capacitor C3 via the switch SW3 and the power supply node N4. In other words, the substrate bias generation circuit VBC stores the charge (positive charge) based on the substrate bias voltage VBP in the capacitor C3 via the switch SW3 and the power supply node N4. Thereby, the capacitor C3 accumulates the charges and obtains the substrate bias voltage VBP. On the other hand, when the switch SW3 is turned off by the monitor circuit M1, the substrate bias voltage VBP is not supplied to the capacitor C3 via switch SW3 and the power supply node N4.

The monitor circuit (the substrate bias monitor circuit) M3 is connected to the power supply node N4 in parallel with the capacitor C3. The monitor circuit M3 monitors the voltage of the power supply node N4 and controls the substrate bias generation circuit VBC based on the voltage of the power supply node N4. The monitor circuit M3 has a threshold voltage (target voltage) VbackP. The monitor circuit M3 supplies a control signal CS3 to the substrate bias generation circuit VBC when the voltage of the power supply node N4 reaches the threshold voltage (target voltage) VbackP. The substrate bias generation circuit VBC then supplies the substrate bias voltage VBP reaching the threshold voltage VbackP as a back bias voltage VPS to a well region of the p-type field effect transistor in the CPU 10, the memory circuit ME1, and the memory circuit ME2. In other words, the substrate bias generation circuit VBC supplies the substrate bias voltage VBP reaching the threshold voltage VbackP to a well region of the p-type SOTB transistors in the CPU 10, the memory circuit ME1, and the memory circuit ME2.

While the back bias voltage VPS and VNS are supplied to the CPU 10, the memory circuit ME1, and the memory circuit ME2, the semiconductor device SC1 consumes less power. Therefore, the power dissipation of the electronic system device 1 is reduced, and the electronic system device 1 operates in the low-consumption mode.

In the foregoing discussion, when the specification signal MCN supports low-speed mode or standby mode, the substrate bias generation circuit VBC begins to generate the substrate bias voltage VBN and VBP based on the mode specification signal VC. However, the substrate bias generation circuit is not limited to this configuration, and the substrate bias generation circuit may begin to generate the substrate bias voltage VBN and VBP when it receives the supply voltage VCC_MCU, regardless of the mode specification signal VC. In that configuration, in low-speed mode or standby mode, the substrate bias generation circuit VBC begins to provide the back bias voltage VNS to the CPU 10, the memory circuit ME1, and the memory circuit ME2 based on both the mode specification signal VC and the control signal CS3. Similarly, in slow or standby mode, the substrate bias generation circuit VBC begins to provide the back bias voltage VPS to the CPU 10, the memory circuit ME1, and the memory circuit ME2 based on both the mode specification signal VC and the control signal CS3.

In addition, the threshold voltage Vst, the threshold voltage Vre, the threshold voltage VbackN, and the threshold voltage VbackP are different from each other.

Figure 2:
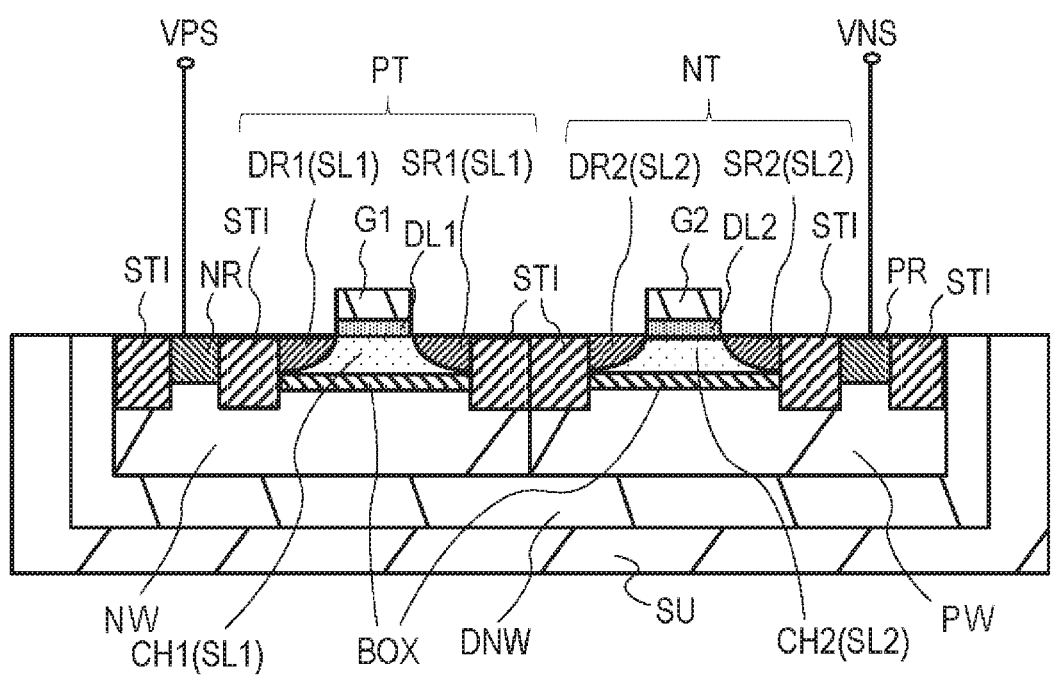
FIG. 2 is a cross-sectional view illustrating an exemplary a SOTB transistor construction.

FIG. 2 is a cross-sectional view illustrating an exemplary the SOTB transistor construction.

In FIG. 2, the p-type SOTB transistor PT and the n-type SOTB transistor NT are shown as the SOTB transistor. The SOTB transistor has a deep n-type well region DNW formed on a p-type substrate SU.

In the p-type SOTB transistor PT, a n-type well region NW are formed on the n-type well region DNW. The insulating film BOX are formed on the n-type well region NW. A semiconductive layer SL1 is formed on the n-type well region NW so as to sandwich the insulating film BOX. In the semiconductive layer SL1, a p+ type region SR1 serving as a source region of the p-type SOTB transistor PT and a p+ type region DR1 serving as a drain region are formed. In the semiconductive layer SL1, a channel region CH1 that does not substantially contain an impurity is formed between the p+ type region SR1 and the p+ type region DR1. An impurity density of the channel region CH1 is $3\times10^{17}$ cm$^{-3}$ or less. A gate electrode G1 of the p-type SOTB transistor PT, via a gate insulating film DL1, is formed on the channel region CH1.

In the n-type SOTB transistor NT, a p-type well region PW is formed on a n-type well region DNW. The insulating film BOX are formed on the p-type well region PW. A semiconductive layer SL2 is formed on the p-type well region PW so as to sandwich the insulating film BOX. In the semiconductive layer SL2, a n+ type region SR2 serving as a source region of the n-type SOTB transistor NT and a n+ type region DR2 serving as the drain region are formed. In the semiconductive layer SL2, a channel region CH2 which does not substantially contain impurities is formed between the n+ type region SR2 and the n+ type region DR2. An impurity density of the channel region CH2 is $3\times10^{17}$ cm$^{-3}$ or less. A gate electrode G2 of the n-type SOTB transistor NT is formed on the channel region CH2 via a gate insulating film DL2.

The thickness of the insulating film BOX is, for example, about 10 nanometers. In the p-type SOTB transistor PT, on the n-type well region NW, the substrate bias generation circuit VBC is a n+ type region NR for supplying the back bias voltage VPS to the n-type well region NW is formed. In the n-type SOTB transistor NT, on the p-type well region PW, the substrate bias generation circuit VBC is a p+ type region PR for supplying the back bias voltage VNS to the p-type well region PW is formed. In addition, the p-type SOTB transistor PT, the n-type SOTB transistor NT, the p+ type region PR, and the n+ type region NR are separated by an element isolation film STI.

For the n-type SOTB transistor NT, setting the back bias voltage VNS to a negative voltage increases the absolute value of the threshold voltage, thereby reducing the leakage current. On the other hand, for the p-type SOTB transistor PT, by setting the back bias voltage VPS to a positive voltage, the absolute value of the threshold voltage becomes larger, enabling the leakage current to be reduced. The leakage current varies exponentially with the change in the back bias voltage.

Therefore, by the back bias voltage VNS and VPS, the threshold voltage of the p-type SOTB transistor PT and the n-type SOTB transistor NT is controlled, the leakage current is suppressed. As a result, it is possible to reduce the power consumed by the CPU 10, the memory circuit ME1, and the memory circuit ME2 including the p-type SOTB transistors PT and the n-type SOTB transistors NT.

Figure 3:
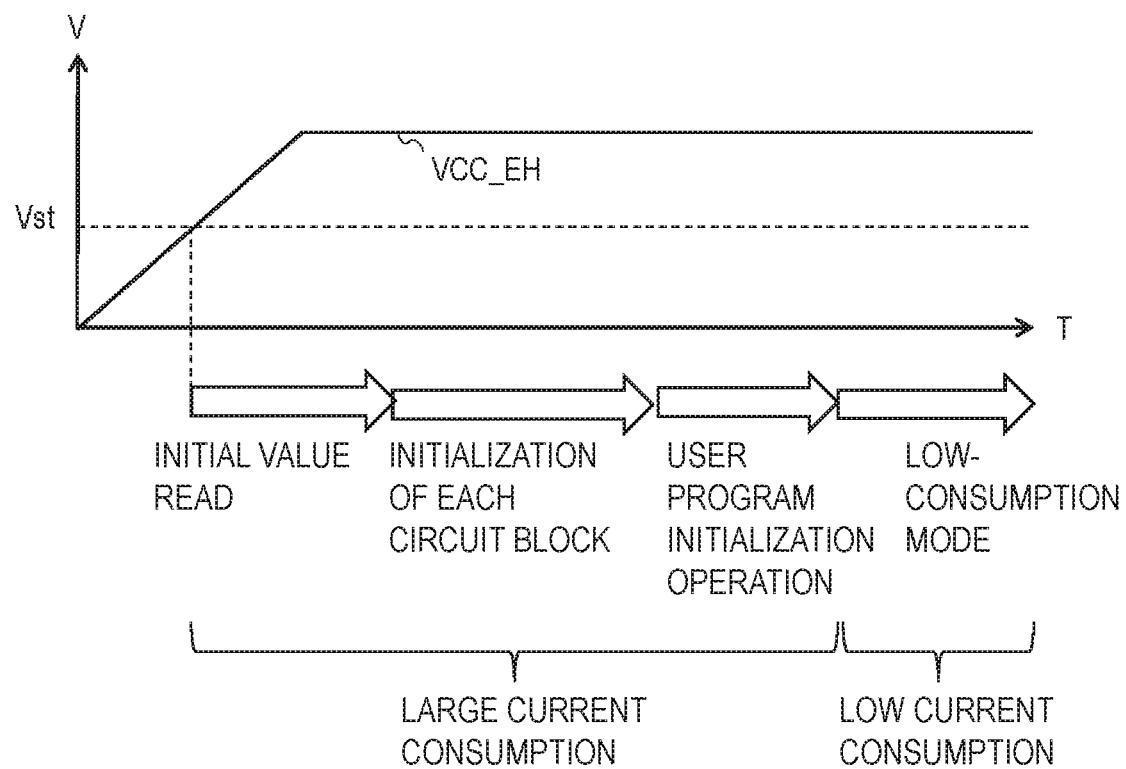
FIG. 3 is a diagram for explaining an exemplary start-up sequence of the electronic system device.

FIG. 3 is a diagram illustrating exemplary activation sequences of the electronic system device 1.

The power generation device P generates the power supply voltage VSC and supplies the power supply voltage VSC to the semiconductor device SC1 and the capacitor C1.

Thus, as shown in FIG. 3, the voltage level of the power supply voltage VCC_EH is increased. When the power supply voltage VCC_EH reaches the threshold voltage Vst, the monitor circuit M1 sets the switch SW1 from the OFF-state to the ON-state. As a result, the control circuit CNT1 starts up and reads the initial value from the memory circuit ME2 (initial value read).

Based on the initial value read from the memory circuit ME2, the control circuit CNT1 sets the internal register RE and other circuit blocks (e.g., the CPU 10, the memory circuits ME1 and ME2, the substrate bias generation circuit VBC) in the control circuit CNT1 from the reset state to initial (Initialization of each circuit block).

After the registers of the respective circuit blocks are initialized, the CPU 10 reads the user program from the memory circuit ME2 and executes the user program. The user program initialization operation is executed first (user program initialization operation). Thereafter, according to the user program, the back bias voltage VPS and VNS begin to be supplied to the CPU 10, the memory circuit ME1 and the memory circuit ME2. Consequently, the electronic system device 1 enters the low-consumption mode, reducing the current consumed by the electronic system device 1. Therefore, the current consumed by the electronic system device 1 is large until the electronic system device 1 enters the low-consumption mode. In other words, the current consumed by the semiconductor device SC1 is large until the semiconductor device SC1 transitions to the low-speed mode or the standby mode.

Figure 4:
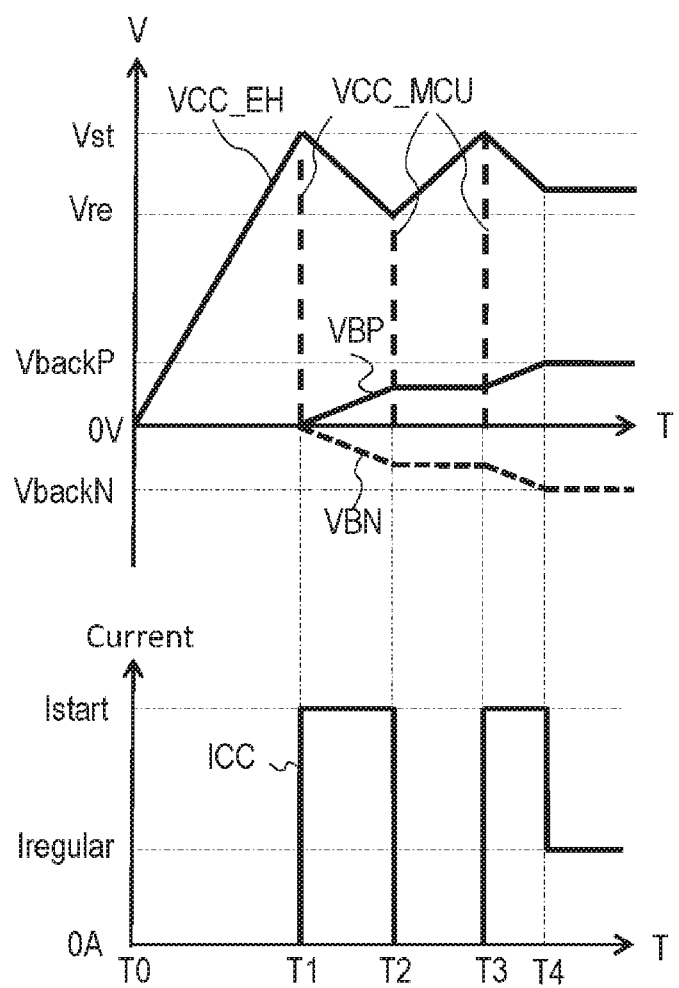
FIG. 4 is a diagram for explaining an exemplary operation of the electronic system device according to the first embodiment.

FIG. 4 is a diagram for explaining an exemplary operation of the electronic system device 1 according to first embodiment. FIG. 4 shows an exemplary power supply voltage VCC_EH, power supply voltage VCC_MCU, the substrate bias voltage VBN, the substrate bias voltage VBP, and current ICC at a starting method of the electronic system device 1.

As shown in FIG. 4, at time T0, the power generation device P generates the power supply voltage VSC and supplies the power supply voltage VSC to the semiconductor device SC1 and the capacitor C1. Thereby, the start operation of the electronic system device 1 is started. The capacitor C1 obtains the power supply voltage VSC as the power supply voltage VCC-EH.

At time T1, the power supply voltage VCC_EH reaches the threshold voltage Vst. The voltages of the power supply node N1 reach the threshold voltage Vst, and the monitor circuit M1 sets the switches SW1, SW2, and SW3 from the OFF-state to the ON-state. The power supply voltage VCC_EH is supplied from the power supply node N1 to the power supply node N2 via the switch SW1. As a result, the power supply voltage VCC_MCU rises, and the power supply voltage VCC_MCU becomes the same value as the power supply voltage VCC_EH. Further, the current ICC flows to the CPU 10, the memory circuits ME1 and ME2, the control circuit CNT1, and the substrate bias generation circuit VBC.

At time T1, the power supply voltage VCC-MCU rises, thereby starting to drive the CPU 10, the memory circuits ME1 and ME2, the control circuit CNT1, and the substrate bias generation circuit VBC. As a result, as described above, the control circuit CNT1 reads the initial value from the memory circuit ME2, and initializes the respective circuit blocks. After the initialization operation of the respective circuit blocks is completed, the CPU 10 reads the user program from the memory circuit ME2 and executes the user program. In accordance with the user program, the CPU 10 provides the specification signal MCN corresponding to slow mode or standby mode to the control circuit CNT1. The control circuit CNT1 supplies the mode specification signal VC to the substrate bias generation circuit VBC, and the substrate bias generation circuit VBC starts generating the substrate bias voltage VBN and VBP from the power supply voltage VCC-MCU.

At time T1, since the switch (first control switch) SW2 is set from the OFF-state to the ON-state by the monitor circuit M1, the substrate bias voltage (first substrate bias voltage) VBN is supplied to the capacitor (first capacitor) C2 via the switch SW2 and the power supply node (second power supply node) N3. Similarly, since the switch SW3 is set from the OFF-state to the ON-state by the monitor circuit M1, the substrate bias voltage (second substrate bias voltage) VBP is supplied to the capacitor (second capacitor) C3 through the switch (second control switch) SW3 and the power supply node (third power supply node) N4. Therefore, while the switch SW2 is set to ON-state, the capacitor C2 accumulates the charges based on the substrate bias voltage VBN. While the switch SW3 is set to ON-state, the capacitor C3 accumulates the charges based on the substrate bias voltage VBP. Consequently, as shown in FIG. 4, the substrate bias voltage VBN begins to drop and the substrate bias voltage VBP begins to rise.

After the time T1, the current consumed by the semiconductor device SC1 may be compensated for by the generated current ISC supplied from the power generation device P and the charges charged in the capacitor C1. An exemplary operation is not shown in FIG. 4, but the substrate bias generation circuit VBC continuously supplies the substrate bias voltage VBN to the capacitor C2 via the switch SW2 and the power supply node N3, and the voltage of the power supply node N3 reaches the threshold voltage VbackN. Similarly, the substrate bias generation circuit VBC continuously supplies the substrate bias voltage VBP to the capacitor C3 via the switch SW3 and the power supply node N4, and the voltage of the power supply node N4 reaches the threshold voltage VbackP. As a result, the monitor circuit M2 outputs the control signal CS2 to the substrate bias generation circuit VBC, and the monitor circuit M3 outputs the control signal CS3 to the substrate bias generation circuit VBC.

Thereby, the substrate bias generation circuit VBC supplies the back bias voltage (first back bias voltage) VNS to the n-type field effect transistor well region in the CPU 10, the memory circuit ME1 and the memory circuit ME2. Similarly, the substrate bias generation circuit VBC supplies the back bias voltage (second back bias voltage) VPS to the p-type field effect transistor well region in the CPU 10, the memory circuit ME1, and the memory circuit ME2. As a result, the power consumed by the CPU 10, the memory circuit ME1, and the memory circuit ME2 is reduced, and the startup operation of the electronic system device 1 is successfully completed.

On the other hand, after the time T1, the consumed current of the semiconductor device SC1 may not be compensated for by the generated current ISC supplied from the power generation device P and the charges charged in the capacitor C1. An exemplary start-up operation of the electronic system device 1 is shown in FIG. 4.

At time T1, the value of the current ICC reaches the current value Istart, and the current ICC flows to the respective circuit blocks of the semiconductor device SC1. As a result, the power supply voltage VCC_EH starts to decrease.

At time T2, the power supply voltage VCC-EH drops and reaches the threshold voltage Vre. Similarly, the power supply voltage VCC-MCU also reaches the threshold voltage Vre.

Since the voltage of the power supply node N1 has reached the threshold voltage Vre, the monitor circuit M1 outputs the reset signal RS1 to the control circuit CNT1. As described above, the internal register RE in the control circuit CNT1 and the internal register in the other circuit blocks of the semiconductor device SC1 (e.g., the CPU 10, the memory circuits ME1 and ME2, and the substrate bias generation circuit VBC) are set from the initialization state to the reset state (reset operation) based on the reset signal RS1.

Since the voltages of the power supply node N1 have reached the threshold voltage Vre, the monitor circuit M1 sets the switches SW1, SW2, and SW3 from the ON-state to the OFF-state. As a result, the power supply voltage VSC and the power supply voltage VCC-EH are not supplied from the power supply node N1 to the power supply node N2. Therefore, at time T2, the power supply voltage VCC-MCU drops to 0V. Similarly, the current ICC flows to the resistor element RMCU and drops to 0A.

Further, since the switches SW2 and SW3 is set to OFF-state from the ON-state, the capacitors C2 and C3 are cut off from the substrate bias generation circuit VBC. As a result, the capacitor C2 holds the charges accumulated from the time T1 to the time T2, and the capacitor C3 store the charges accumulated from the time T1 to the time T2. In other words, while the switch SW2 is set to OFF-state, the capacitor C2 store the charges that has accumulated from time T1 to time T2. While the switch SW3 is set to OFF-state, the capacitor C3 turns store the charges stored from time T1 to time T2.

Since the power supply node N1 and the power supply node N2 are cut off by the switch SW1 after the time T2, the load connected to the capacitor C1 is reduced. As a result, the capacitor C1 starts to be recharged by the power generation device P, and the power supply voltage VCC-EH rises. Accordingly, since the voltage of the power supply node N1 exceeds the threshold voltage Vre, the reset state of the respective circuit blocks is released.

At time T3, the power supply voltage VCC_EH reaches the threshold voltage Vst. Thereby, the monitor circuit M1 again sets the switches SW1, SW2, and SW3 from the OFF-state to the ON-state. As a result, the power supply voltage VCC_MCU rises, the power supply voltage VCC_MCU becomes the same value as the power supply voltage VCC_EH, the current ICC flows to each circuit block. Thereby, the CPU 10, the memory circuits ME1 and ME2, the control circuit CNT1, and the substrate bias generation circuit VBC are driven again.

At time T3, similarly to time T1, the initialization operation of the respective circuit blocks starts, and the CPU 10 executes the user program. As a result, the control circuit CNT1 supplies the mode specification signal VC to the substrate bias generation circuit VBC, and the substrate bias generation circuit VBC starts to generate the substrate bias voltage VBN and VBP from the power supply voltage VCC-MCU, similarly to the time T1.

At time T3, similar to time T1, the substrate bias generation circuit VBC starts supplying the substrate bias voltage VBN to the capacitor C2 via the switch SW2 and the power supply node N3. Similarly, the substrate bias generation circuit VBC starts supplying the substrate bias voltage VBP to the capacitor C3 via the switch SW3 and the power supply node N4. That is, in the capacitor C2, the substrate bias generation circuit VBC further adds the charges based on the substrate bias voltage VBN to charge held between the time T2 and the time T3. Similarly, in the capacitor C3, the substrate bias generation circuit VBC further adds the charges based on the substrate bias voltage VBP to charge held between the time T2 and the time T3. In other words, while the switch SW2 is set to ON-state, the substrate bias generation circuit VBC additionally adds the charges based on the substrate bias voltage VBN to charge held by the capacitor C2. While switch SW3 is set to ON, the substrate bias generation circuit VBC additionally adds the charges based on the substrate bias voltage VBP to charge held by the capacitor C3. Consequently, as in FIG. 4, again the substrate bias voltage VBN begins to drop and the substrate bias voltage VBP begins to rise.

At time T4, the substrate bias voltage VBN reaches the threshold voltage VbackN. That is, the voltage based on the charges in the capacitor C2 reaches the threshold voltage VbackN. As a result, the voltage of the power supply node N3 reaches the voltage of the threshold voltage VbackN, and the monitor circuit M2 outputs the voltage of the control signal CS2 to the substrate bias generation circuit VBC.

Similarly, at time T4, the substrate bias voltage VBP reaches the threshold voltage VbackP. That is, the voltage based on the charges in the capacitor C3 reaches the threshold voltage VbackP. As a result, the voltage of the power supply node N4 reaches the voltage of the threshold voltage VbackP, and the monitor circuit M3 outputs the voltage of the control signal CS3 to the substrate bias generation circuit VBC.

Thereby, as described above, the substrate bias generation circuit VBC supplies the substrate bias voltage VBN reaching the threshold voltage VbackN as the back bias voltage VNS to the n-type field effect transistor well region in the CPU 10, the memory circuit ME1, the memory circuit ME2. The substrate bias generation circuit VBC supplies the substrate bias voltage VBP reaching the threshold voltage VbackP as the back bias voltage VPS to the p-type field effect transistor well region in the CPU 10, the memory circuit ME1, and the memory circuit ME2. As a result, the electronic system device 1 operates in the low consumption mode, and the power consumption of the CPU 10, the memory circuit ME1, and the memory circuit ME2 is reduced. Accordingly, the electronic system device 1 can successfully complete the startup operation. In addition, the current consumption of the semiconductor device SC1 decreases, and the current ICC is maintained at the value of the current Iregular.

Therefore, the electronic system device 1 can complete the starting operation by two driving operations and one resetting operation. The electronic system device 1 can stably complete the start-up sequence by repeatedly performing the driving operation and the resetting operation a plurality of times.

That is, as described above, the starting method of the electronic system device 1 has the following a first step, a second step, a third step, and a fourth step. At the first step, the capacitor C2 accumulates the charges based on the substrate bias voltage VBN, and the capacitor C3 accumulates charge based on the substrate bias voltage VBP. At a second step after the first step, each of the capacitor C2 and the capacitor C3 store the charges stored by the first step. At a third step after the second step, the substrate bias generation circuit VBC obtains the back bias voltage VNS on charge that the capacitor C2 had held by the second step by further pouring and adding the charge based on the substrate bias voltage VBN, based on the poured charge. Likewise, the substrate bias generation circuit VBC further adds the charges based on the substrate bias voltage VBP to charge that the capacitor C3 was holding by the second step, and obtains the back bias voltage VNP based on added the charges. At a fourth step after the third step, when the voltage of the power supply node N3 reaches the threshold voltage VbackN, the substrate bias generation circuit VBC supplies back bias voltage VNS to well region of the field effect transistor (n-type SOTB transistor) of the CPU 10, the memory circuit ME1 and the memory circuit ME2. Similarly, when the voltage of the power supply node N4 reaches the threshold voltage VbackP, the substrate bias generation circuit VBC supplies the back bias voltage VNP to the field effect transistor (p-type SOTB transistor) well region of the CPU 10, the memory circuit ME1, and the memory circuit ME2.

In addition, even if the electronic system device 1 shifts to the resetting operation during the starting operation of the electronic system device 1, the capacitors C2 and C3 retain the charges. Therefore, the time for the substrate bias voltage VBP to reach the threshold voltage VbackP is shortened, and similarly, the time for the substrate bias voltage VBP to reach the threshold voltage VbackP is shortened. As a result, the substrate bias generation circuit VBC can immediately provide each of the back bias voltage VNS and VPS to well region of the field effect transistors in the CPU 10, the memory circuit ME1, and the memory circuit ME2. Consequently, the electronic system device 1 immediately enters a low-power mode, reducing the power dissipation of the electronic system device 1.

Comparative Example

Figure 5:
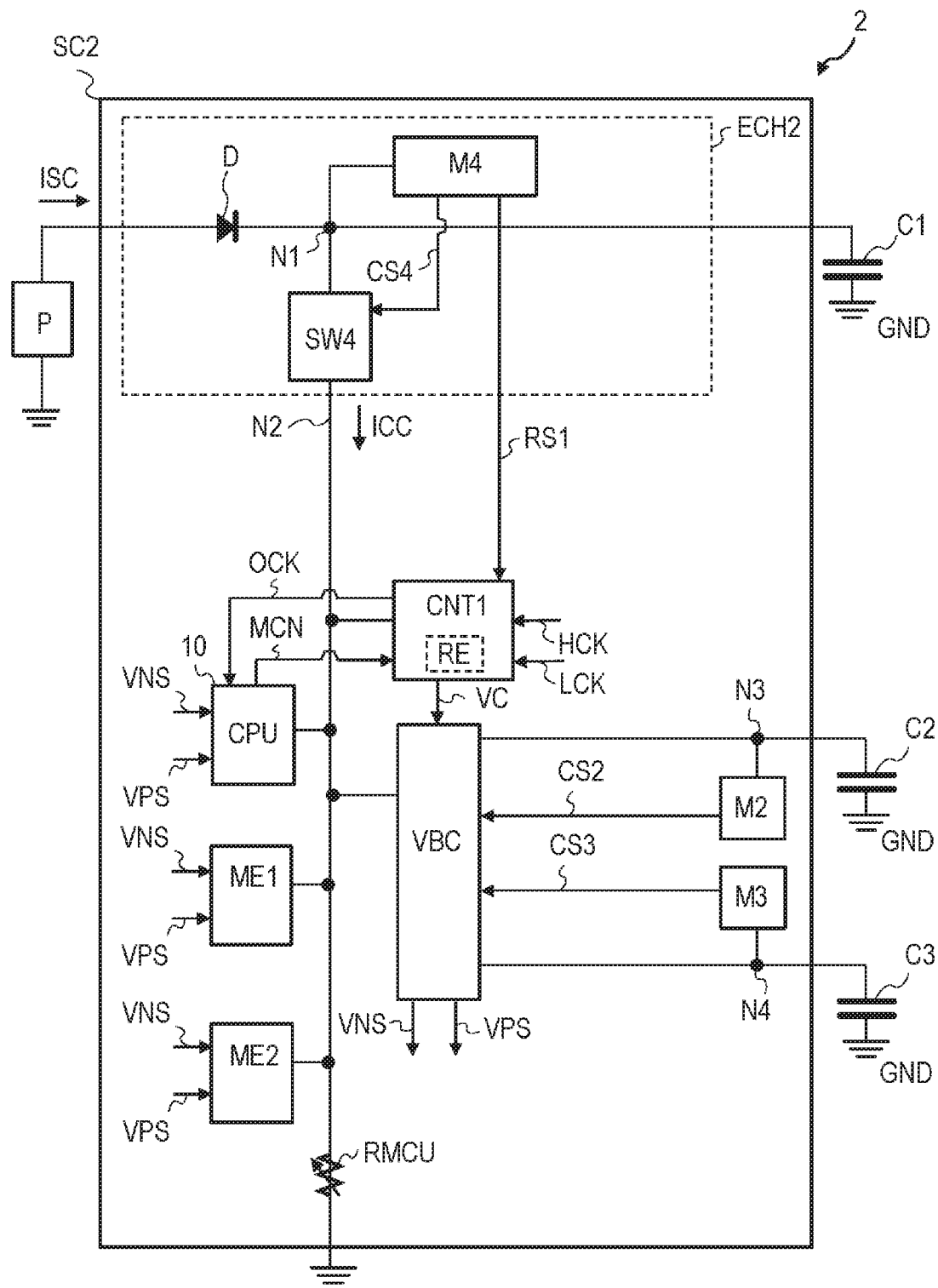
FIG. 5 is a block diagram illustrating a configuration example of an electronic system device according to a comparative example.

FIG. 5 is a block diagram illustrating a configuration example of an electronic system device 2 according to the comparative example.

The electronic system device 2 comprises the power generation device P, a semiconductor device SC2, the capacitor C1, the capacitor C2, and the capacitor C3. In the electronic system device 2, since the configuration except for the semiconductor device SC2 is the same as that of the electronic system device 1, the same reference numerals are given, and descriptions thereof are omitted.

The semiconductor device SC2 has a power supply circuit ECH2 instead of the power supply circuit ECH1 of the semiconductor device SC1. The power supply circuit ECH2 has a monitor circuit M4 instead of the monitor circuit M1 of the power supply circuit ECH1. The power supply circuit ECH2 has a switch SW4 instead of the switch SW1 of the power supply circuit ECH1. In the power supply circuit ECH2, the configuration other than the monitor circuit M4 and the switch SW4 is the same as the configuration of the power supply circuit ECH1, and therefore the explanation thereof is omitted.

Further, the semiconductor device SC2 does not include the switches SW2 and SW3 as compared with the semiconductor device SC1. Since the rest of the configuration in the semiconductor device SC2 is the same as the configuration in the semiconductor device SC1, the same reference numerals are assigned, and descriptions thereof are omitted.

The monitor circuit M4 monitors the voltage of the power supply node N1, and controls the switch SW4 and the control circuit CNT1 based on the voltage of the power supply node N1. The monitor circuit M4 supplies a control signal CS4 to the switch SW4. The monitor circuit M4 supplies the reset signal RS1 to the control circuit CNT1 in the same manner as the monitor circuit M1. The monitor circuit M4, like the monitor circuit M1, has the threshold voltage Vst and threshold voltage Vre.

Like the switch SW1, the switch SW4 is connected to the power generation device P via the power supply node N1 and the diode D. The switch SW4 is disposed between the power supply node N1 and the power supply node N2. The switch SW 4 is the same as the switch SW1 except that it is controlled based on the control signal CS4 instead of the control signal CS1. In addition, while the switch SW4 is set to the ON-state, similarly to the semiconductor device SC1, the CPU 10, the memory circuit ME1, the memory circuit ME2, the control circuit CNT1, and the substrate bias generation circuit VBC receive the power supply voltage VCC_MCU based on the power supply voltage VSC and the power supply voltage VCC_EH via the power supply node N2, and operate based on the power supply voltage VCC_MCU. On the other hand, while the switch SW4 is turned off, the power supply node N1 and the power supply node N2 are shut off by the switch SW4.

Figure 6:
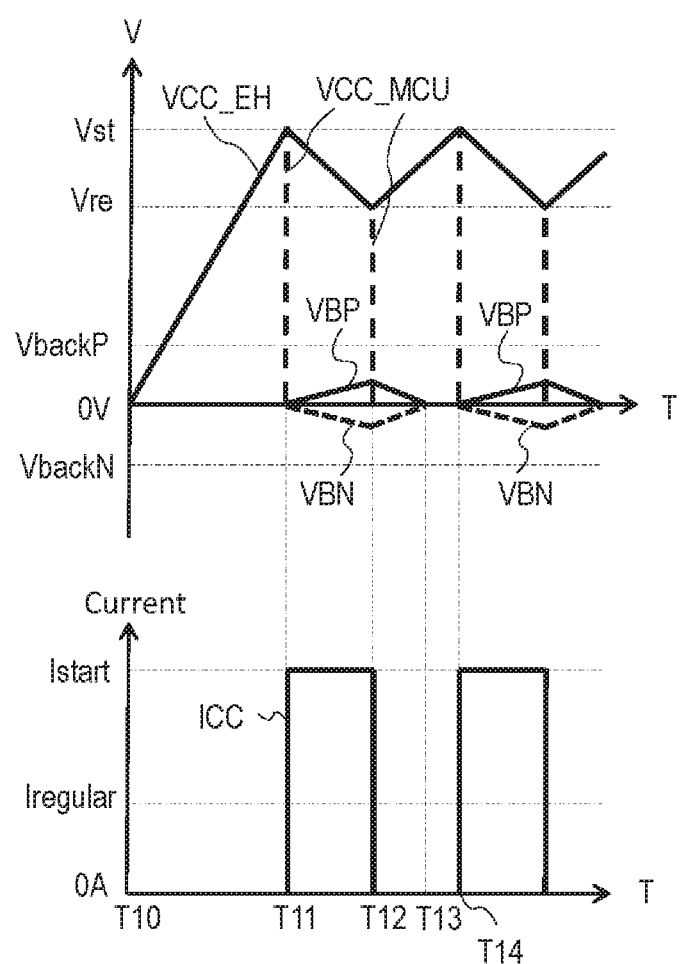
FIG. 6 is a diagram for explaining an example of the operation of the electronic system device according to the comparative example.

FIG. 6 is a diagram for explaining an example of the operation of the electronic system device 2 according to the comparative example. FIG. 6 shows an exemplary power supply voltage VCC_EH, power supply voltage VCC_MCU, power supply voltage VCC_MCU, the substrate bias voltage VBN, the substrate bias voltage VBP, and current ICC at a starting method of the electronic system device 2, similar to FIG. 4.

At time T10, as at time T0, the power generation device P supplies power supply voltages VSC to the semiconductor device SC2 and the capacitor C1. Thereby, the start operation of the electronic system device 2 is started. The capacitor C1 obtains the power supply voltage VSC as the power supply voltage VCC-EH.

At time T11, when the power supply voltage VCC_EH reaches the threshold voltage Vst, the switch SW4 is set from the OFF-state to the ON-state by the control signal CS4. As a result, similarly to the time T1, the CPU 10, the memory circuits ME1 and ME2, the control circuit CNT1, and the substrate bias generation circuit VBC start to be driven. Similar to time T1, the CPU 10 executes the user program. Thus, the substrate bias generation circuit VBC begins to generate the substrate bias voltage VBN and VBP from the supply voltage VCC_MCU.

Further, at time T11, like at time T1, the substrate bias generation circuit VBC supplies the substrate bias voltage VBN to the capacitor C2, and the capacitor C2 accumulates the charges. Similarly, the substrate bias generation circuit VBC supplies the substrate bias voltage VBP to the capacitor C3, and the capacitor C3 stores the charges. Consequently, the substrate bias voltage VBN begins to drop and the substrate bias voltage VBP begins to rise.

After time T11, similarly to first embodiment, the current consumed by the semiconductor device SC2 may not be compensated for by the generated current ISC supplied from the power generation device P and the charges charged in the capacitor C1. An example of the starting operation in this case is shown in FIG. 6.

At the time T11, similarly to the time T1, the value of the current ICC reaches the current value Istart, and the current ICC flows to the respective circuit blocks of the semiconductor device SC2. As a result, the power supply voltage VCC_EH starts to decrease.

At time T12, similarly to time T2, the power supply voltage VCC_EH and the power supply voltage VCC_MCU is lowered, reaches the threshold voltage Vre.

As a result, since the voltage of the power supply node N1 reaches the threshold voltage Vre, the monitor circuit M4 sets the switch SW4 from the ON-state to the OFF-state. Similar to the time T2, the power supply voltage VCC_MCU and the current ICC are lowered, and the reset operation is performed.

At time T12, unlike the electronic system device 1, the capacitors C2 and C3 of the electronic system device 2 are connected to the substrate bias generation circuit VBC. At time T12, the substrate bias generation circuit VBC is undefined because the power supply voltage VCC_MCU is not supplied to the substrate bias generation circuit VBC. As a result, a leakage current is generated, and the charges accumulated in the capacitors C2 and C3 escapes. The substrate bias voltage VBN and VBP based on the charges in the capacitors C2 and C3 transition to 0V.

At time T13, the substrate bias voltage VBN and VBP reach 0V.

Since the power supply node N1 and the power supply node N2 are shut off by the switch SW4 after the time T13, the load connected to the capacitor C1 is reduced. As a result, the capacitor C1 starts to be recharged by the power generation device P, and the power supply voltage VCC-EH rises. Accordingly, at the time T14, similarly to the time T11, the monitor circuit M4 again sets the switch SW4 from the OFF-state to the ON-state, the power supply voltage VCC_MCU rises, and the current ICC flows to the respective circuit blocks.

The operation of the electronic system device 2 after the time T14 is repeated. Therefore, the substrate bias voltage VBN based on the charges in the capacitor C2 cannot reach the threshold voltage VbackN. Similarly, the substrate bias voltage VBP based on the charges in the capacitor C3 cannot reach the threshold voltage VbackP. Therefore, the substrate bias generation circuit VBC cannot supply the back bias voltage VNS and VPS to the CPU 10, the memory circuit ME1 and the memory circuit ME2, and the electronic system device 2 cannot shift to the low-consumption mode. In other words, the current draw of the electronic system device 2 remains large. As a result, the startup operation of the electronic system device 2 cannot be successfully completed.

On the other hand, as described above, even if the electronic system device 1 of first embodiment shifts to the resetting operation during the starting operation, the capacitors C2 and C3 retain the charges. Therefore, the electronic system device 1 immediately shifts to the low-consumption mode. Compared to the electronic system device 2 of the comparative examples, the electronic system device 1 of first embodiment can stably execute the start-up sequences and complete the start-up operation.

Second Embodiment

Figure 7:
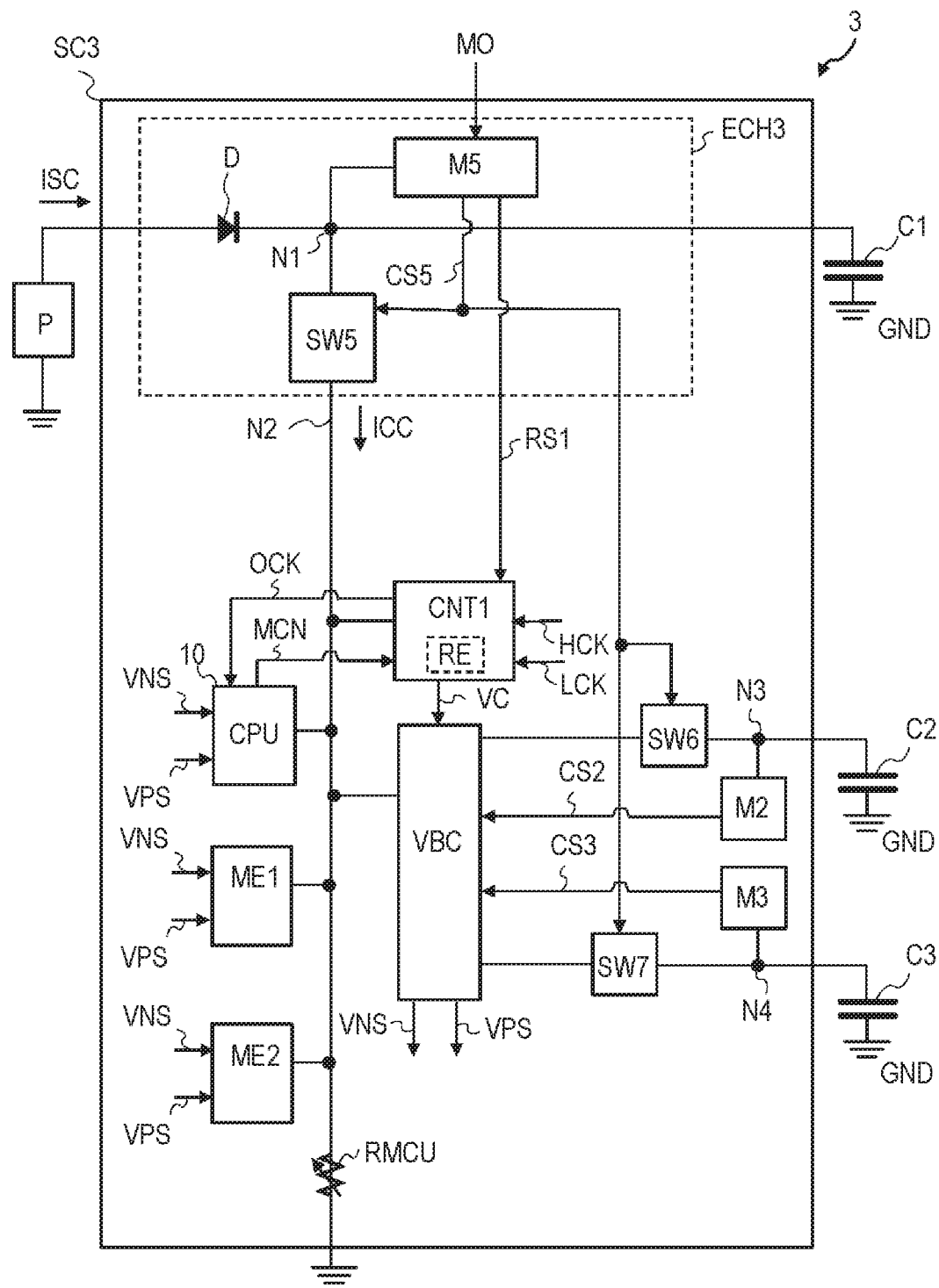
FIG. 7 is a block diagram illustrating an exemplary configuration of the electronic system device according to a second embodiment.

FIG. 7 is a block diagram illustrating an exemplary configuration of an electronic system device 3 according to second embodiment.

The electronic system device 3 includes the power generation device P, a semiconductor device SC3, the capacitor C1, the capacitor C2, and the capacitor C3. In the electronic system device 3, since the configuration except for the semiconductor device SC3 is the same as that of the electronic system device 1, the same reference numerals are given, and descriptions thereof are omitted.

The semiconductor device SC3 has a power supply circuit ECH3 instead of the power supply circuit ECH1 of the semiconductor device SC1. The power supply circuit ECH3 has a monitor circuit (power supply monitor circuit) M5 instead of the monitor circuit M1 of the power supply circuit ECH1. The power supply circuit ECH3 has a switch (power switch) SW5 instead of the switch SW1 of the power supply circuit ECH1. In the power supply circuit ECH3, the configuration other than the monitor circuit M5 and the switch SW5 is the same as the configuration of the power supply circuit ECH1, and therefore the explanation thereof is omitted.

The Semiconductor device SC3 has a switch (control switch) SW6 instead of the switch SW2 of the semiconductor device SC1. Further, the semiconductor device SC3 has a switch (control switch) SW7 instead of the switch SW3 of the semiconductor device SC1. In the semiconductor device SC3, the configuration other than the power supply circuit ECH3, the switch SW6, and the switch SW7 are the same as the configuration of the semiconductor device SC1, and therefore the explanation thereof is omitted.

The monitor circuit (power supply monitor circuit) M5, like the monitor circuit M1, is connected to the power generation device P via the power supply node N1 and the diode D. The monitor circuit M5 monitors the voltage of the power supply node N1 and supplies a control signal CS5 to the switches SW5, SW6, and SW7. Therefore, the monitor circuit M5 sets the switches SW5, SW6, and SW7 to ON-state or OFF-state based on the control signal CS5. The monitor circuit M5 supplies the reset signal RS1 to the control circuit CNT1 in the same manner as the monitor circuit M1.

The monitor circuit M5 has a threshold voltage VstH and a threshold voltage VstL instead of the threshold voltage (second threshold voltage) Vst of the monitor circuit M1. The threshold voltage VstL is lower than the threshold voltage VstH. Like the monitor circuit M1, the monitor circuit M5 also has the threshold voltage (the third threshold voltage) Vre as threshold voltage. The threshold voltage VstH, the threshold voltage VstL, the threshold voltage Vre, the threshold voltage VbackN, and the threshold voltage VbackP are different from each other.

The monitor circuit M5 receives an external mode signal MO, unlike the monitor circuit M1. The monitor circuit M5 selects the threshold voltage VstH or the threshold voltage VstL based on the external mode signal MO.

Specifically, the monitor circuit M5 selects the threshold voltage VstH as the threshold voltage based on the external mode signal MO (e.g., High level external mode signal MO). Thus, the threshold voltage of the monitor circuit M5 is set to the threshold voltage VstH. The monitor circuit M5 then outputs the control signal CS5 (e.g., High level control signal CS5) when the voltage of the power supply node N1 reaches the threshold voltage VstH, and the switches SW5, SW6, and SW7 are set from the OFF-state to the ON-state based on the control signal CS5.

The monitor circuit M5 selects the threshold voltage VstL as threshold voltage based on the external mode signal MO (e.g., low-level external mode signal MO). Thus, the threshold voltage of the monitor circuit M5 is set to the threshold voltage VstL. The monitor circuit M5 then outputs the control signal CS5 (e.g., High level control signal CS5) when the voltage of the power supply node N1 reaches the threshold voltage VstL, and the switches SW5, SW6, and SW7 are set from the OFF-state to the ON-state based on the control signal CS5. Therefore, based on the external mode signal MO, the value of the threshold voltage of the monitor circuit M5 is changed from the threshold voltage VstH to the threshold voltage VstL.

Similar to the monitor circuit M1, the monitor circuit M5 outputs the control signal CS5 (e.g., low-level control signal CS5) when the voltage of the power supply node N1 drops, thereby the voltage of the power supply node N1 reaches the threshold voltage Vre, and the switches SW5, SW6, and SW7 are set from the ON-state to the OFF-state based on the control signal CS5.

Similar to the monitor circuit M1, the monitor circuit M5 outputs the reset signal RS1 to the control circuit CNT1 when the voltage of the power supply node N1 drops, thereby causing the voltage of the power supply node N1 to reach the threshold voltage Vre. As a result, a reset operation is performed. On the other hand, similarly to the monitor circuit M1, when the voltage of the power supply node N1 is higher than the threshold voltage Vre, the control circuit CNT1 releases the reset state of the respective circuit blocks.

Like the switch SW1, the switch SW5 is connected to the power generation device P via the power supply node N1 and the diode D. The switch SW5 is disposed between the power supply node N1 and the power supply node N2. The switch SW 5 is similar to the switch SW1, except that it is controlled based on the control signal CS5 instead of the control signal CS1, as compared with the switch SW1.

When the switch SW5 is turned on, the CPU 10, the memory circuit ME1, the memory circuit ME2, the control circuit CNT1, and the substrate bias generation circuit VBC receive the power supply voltage VCC_MCU based on the power supply voltage VSC and the power supply voltage VCC_EH via the power supply node N2. In other words, their circuitry blocks receive at least the power supply voltage VSC generated by the power generation device P as the power supply voltage VCC_MCU.

On the other hand, when the switch SW5 is turned off, the power supply node N1 and the power supply node N2 are shut off by the switch SW5.

Like the switch SW2, the switch SW6 is disposed between the substrate bias generation circuit VBC and the capacitor C2. The switch SW 6 is similar to the switch SW2, except that it is controlled based on the control signal CS5 instead of the control signal CS1, as compared with the switch SW2. Therefore, when the switch SW6 is set to the ON-state by the monitor circuit M5, the substrate bias generation circuit VBC supplies the substrate bias voltage VBN to the capacitor C2 via the switch SW6 and the power supply node N3. On the other hand, when the switch SW6 is turned off by the monitor circuit M5, the substrate bias voltage VBN is not supplied to the capacitor C2 via the switch SW6 and the power supply node N3.

Like the switch SW3, the switch SW7 is disposed between the substrate bias generation circuit VBC and the capacitor C3. The switch SW7 is similar to the switch SW3, except that it is controlled based on the control signal CS5 instead of the control signal CS1, as compared with the switch SW3. Therefore, when the switch SW7 is set to the ON-state by the monitor circuit M5, the substrate bias generation circuit VBC supplies the substrate bias voltage VBN to the capacitor C3 via the switch SW7 and the power supply node N3. On the other hand, when the switch SW7 is turned off by the monitor circuit M5, the substrate bias voltage VBP is not supplied to the capacitor C3 via the switch SW7 and the power supply node N3.

Figure 8:
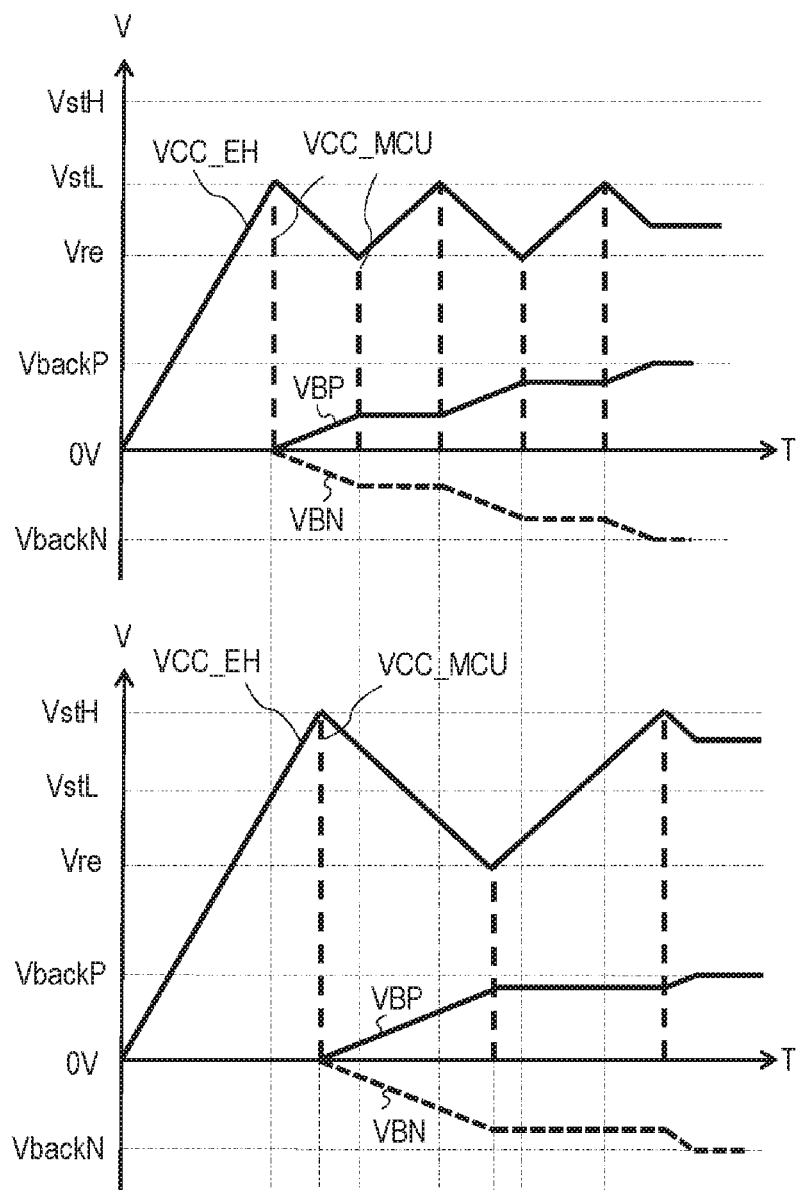
FIG. 8 is a diagram for explaining an exemplary operation of the electronic system device according to the second embodiment.

FIG. 8 is a diagram for explaining an exemplary operation of the electronic system device 3 according to second embodiment. FIG. 8 also shows an example of the power supply voltage VCC_EH, power supply voltage VCC_MCU, the substrate bias voltage VBN, and the substrate bias voltage VBP at a starting method of the electronic system device 3 as in FIG. 4. The startup operation of the electronic system device 3 has the above-mentioned the first step, the second step, the third step, and the fourth step, similarly to the startup operation of the electronic system device 1.

The upper part of FIG. 8 shows an exemplary operation of the electronic system device 3 when the threshold voltage of the monitor circuit M5 is set to the threshold voltage VstL. The monitor circuit M5 selects the threshold voltage VstL based on the external mode signal MO. Therefore, when the power supply voltage VCC_EH reaches the threshold voltage VstL, the monitor circuit M5 sets the switches SW5, SW6, and SW7 from the OFF-state to the ON-state. Similar to the electronic system device 1, the electronic system device 3 starts the above-described driving operation, the initialization operation of the respective circuit blocks, and the actual operation of the user program. When the power supply voltage VCC_EH drops and reaches the threshold voltage Vre, the monitor circuit M5 sets the switches SW5, SW6, and SW7 from the ON-state to the OFF-state, and outputs the reset signal RS1 to the control circuit CNT1. The electronic system device 3 starts a resetting operation in the same manner as the electronic system device 1. The other operations are the same as those of the electronic system device 1, and therefore their descriptions are omitted. Therefore, as shown in the upper stage of FIG. 8, when the threshold voltage of the monitor circuit M5 is the threshold voltage VstL, the electronic system device 3, by three drive operations and two resetting operations, it is possible to complete the startup operation.

On the other hand, the lower part of FIG. 8 shows an exemplary operation of the electronic system device 3 when the threshold voltage of the monitor circuit M5 is set to the threshold voltage VstH. The monitor circuit M5 selects the threshold voltage VstH based on the external mode signal MO. In other words, the monitor circuit M5 is changed from the threshold voltage VstL to the threshold voltage VstH based on the external mode signal MO. Therefore, when the power supply voltage VCC_EH reaches the threshold voltage VstH, the monitor circuit M5 sets the switches SW5, SW6, and SW7 from the OFF-state to the ON-state. Similar to the electronic system device 1, the electronic system device 3 starts the above-described driving operation, the initialization operation of the respective circuit blocks, and the user program. When the power supply voltage VCC_EH drops and reaches the threshold voltage Vre, the monitor circuit M5 sets the switches SW5, SW6, and SW7 from the ON-state to the OFF-state, and outputs the reset signal RS1 to the control circuit CNT1. The electronic system device 3 starts a resetting operation in the same manner as the electronic system device 1. The other operations are the same as those of the electronic system device 1, and therefore their descriptions are omitted. Therefore, as shown in the lower part of FIG. 8, when the threshold voltage of the monitor circuit M5 is the threshold voltage VstH, the electronic system device 3 can complete the starting operation by two driving operations and one resetting operation.

As shown in FIG. 8, the voltage difference between the threshold voltage VstH and the threshold voltage Vre is larger than the voltage difference between the threshold voltage VstL and the threshold voltage Vre. Therefore, when the threshold voltage of the monitor circuit M5 is the threshold voltage VstH, the switches SW5, SW6, and SW7 transition from the ON-state to the OFF-state is longer than when the threshold voltage of the monitor circuit M5 is the threshold voltage VstL. As a result, the substrate bias generation circuit VBC operate for a long time, and the amounts of charge supplied to the capacitors C2 and C3 are large. Thus, compared to the threshold voltage VstL, for the threshold voltage VstH, the electronic system device 3 can reduce the number of drive and reset operations, thereby reducing the current draw due to their operation.

In addition, the electronic system device 3 is suitable for use in a variety of environmentals because it can change the threshold voltage compared to electronic system device 1. For example, if the amount of sunlight is small, the threshold voltage of the monitor circuit M5 is set to the threshold voltage VstL. In this instance, the monitor circuit M5 can set the switches SW5, SW6, and SW7 from the OFF-state to the ON-state even if the amount of power supplied from the power generation device P is small. As a result, the electronic system device 3 can stably complete the start-up sequence.

Third Embodiment

Figure 9:
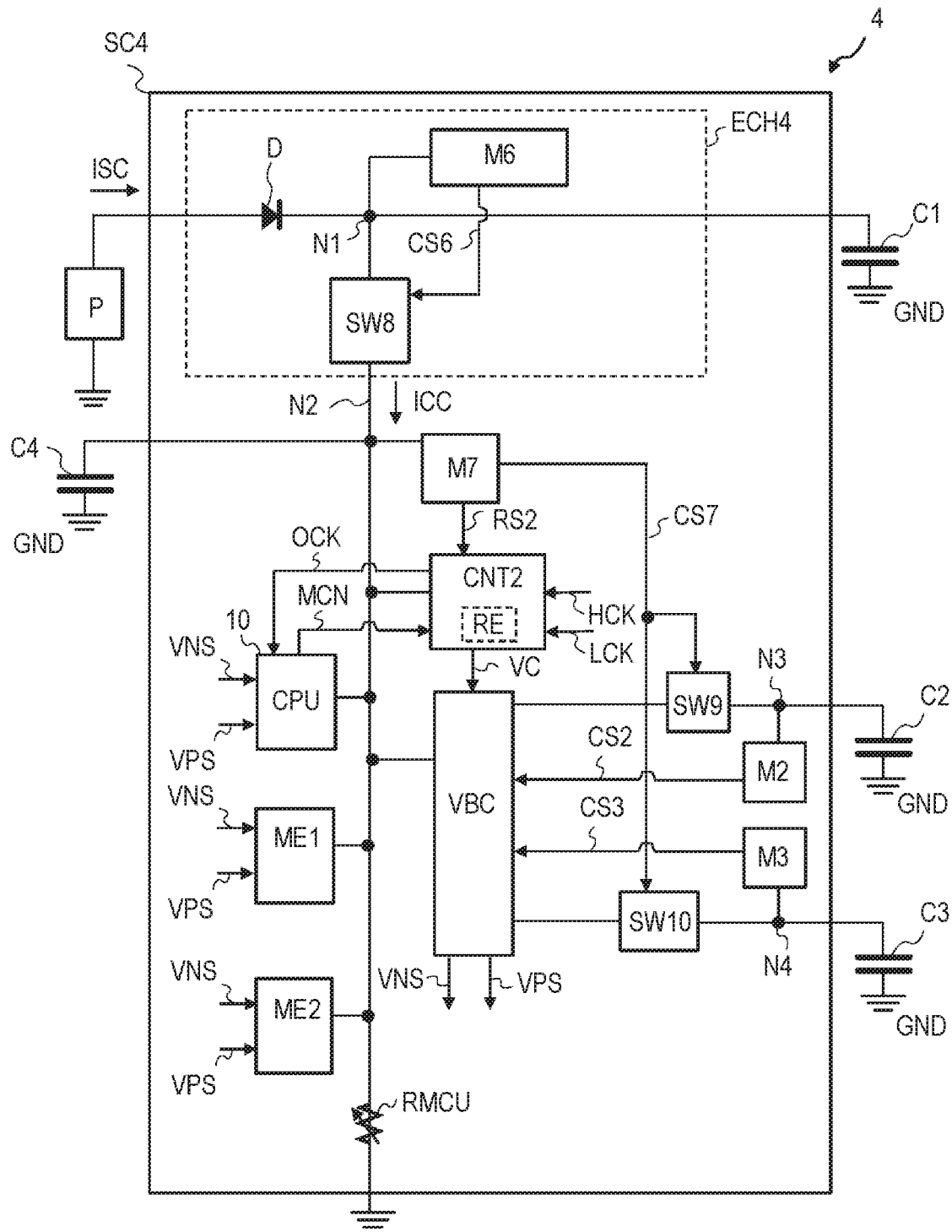
FIG. 9 is a block diagram illustrating an exemplary configuration of the electronic system device according to a third embodiment.

FIG. 9 is a block diagram illustrating an exemplary configuration of an electronic system device 4 according to third embodiment.

The electronic system device 4 includes the power generation device P, a semiconductor device SC4, the capacitor (second capacitor) C1, capacitor (capacitor) C2, the capacitor (first (capacitor) C3, and capacitor C4. In the electronic system device 4, since the configuration except for the capacitor C4 and the semiconductor device SC4 is the same as that of the electronic system device 1, the same reference numerals are given, and descriptions thereof are omitted.

The semiconductor device SC4 has a power supply circuit ECH4 instead of the power supply circuit ECH1 of the semiconductor device SC1. The power supply circuit ECH4 has a monitor circuit (first power supply monitor circuit) M6 instead of the monitor circuit M1 of the power supply circuit ECH1. The power supply circuit ECH4 has a switch (power switch) SW8 instead of the switch SW1 of the power supply circuit ECH1. In the power supply circuit ECH4, the configuration other than the monitor circuit M6 and the switch SW8 is the same as the configuration of the power supply circuit ECH1, and therefore the explanation thereof is omitted.

The semiconductor device SC4 has a switch (control switch) SW9 instead of the switch SW2 of the semiconductor device SC1. The semiconductor device SC4 has a switch (control switch) SW10 instead of the switch SW3 of the semiconductor device SC1. The semiconductor device SC4 has a control circuit CNT2 instead of the control circuit CNT1 of the semiconductor device SC1. The semiconductor device SC4 differs from the semiconductor device SC1 in that it further has a monitor circuit (second power supply monitor circuit) M7. In the semiconductor device SC4, the configuration except for the power supply circuit ECH4, the monitor circuit M7, the switch SW9, the switch SW10, and the control circuit CNT2 is the same as the configuration of the semiconductor device SC1, and therefore the explanation thereof is omitted.

The monitor circuit M6, like the monitor circuit M1, is connected to the power generation device P via the power supply node N1 and the diode D. The monitor circuit M6 monitors the voltages of the power supply node N1 and supplies a control signal CS6 to the switch SW8. Therefore, the monitor circuit M6 sets the switch SW8 to ON-state or OFF-state based on the control signal CS6. Like the monitor circuit M1, the monitor circuit M6 has the threshold voltage Vst and the threshold voltage Vre as the threshold voltage.

The monitor circuit M6 outputs the control signal CS6 (e.g., a High level control signal CS6) when the voltage of the power supply node N1 reaches the threshold voltage (the second threshold voltage) Vst, and the switch SW8 is set from the OFF-state to the ON-state based on the control signal CS1. The monitor circuit M6 outputs the control signal CS6 (e.g., the low-level control signal CS6) when the voltage of the power supply node N1 drops and thereby the voltage of the power supply node N1 reaches the threshold voltage (the third threshold voltage) Vre, and the switch SW8 is set from the ON-state to the OFF-state based on the control signal CS6.

Like the switch SW1, the switch SW8 is connected to the power generation device P via the power supply node N1 and the diode D. The switch SW8 is disposed between the power supply node N1 and the power supply node (second power supply node) N2. The switch SW8 is similar to the switch SW1, except that it is controlled based on the control signal CS6 instead of the control signal CS1, as compared with the switch SW1.

Also, when the switch SW9 is set to ON-state, the CPU 10, the memory circuit ME1, the memory circuit ME2, the control circuit CNT2, the monitor circuit M7, and the substrate bias generation circuit VBC receive a power supply voltage VCC_MCU based on the power supply voltage VSC and the power supply voltage VCC_EH via the power supply node N2. In other words, their circuitry blocks receive at least the power supply voltage VSC generated by the power generation device P as the power supply voltage VCC_MCU.

On the other hand, when the switch SW9 is turned off, the power supply node N1 and the power supply node N2 are shut off by the switch SW9.

Like the switch SW2, the switch SW9 is disposed between the substrate bias generation circuit VBC and the capacitor (first capacitor) C2. The switch SW9 is similar to the switch SW2, except that it is controlled based on a control signal CS7 instead of the control signal CS1, as compared with the switch SW2. Therefore, when the switch SW9 is set to the ON-state by the monitor circuit M7, the substrate bias generation circuit VBC supplies the substrate bias voltage VBN to the capacitor C2 via the switch SW9 and a power supply node (third power supply node) N3. On the other hand, if the switch SW9 is turned off by the monitor circuit M7, the substrate bias voltage VBN is not supplied to the capacitor C2 via the switch SW9 and the power supply node N3.

Like the switch SW3, the switch SW10 is disposed between the substrate bias generation circuit VBC and the capacitor (first capacitor) C3. The switch SW10 is similar to the switch SW3, except that it is controlled based on the control signal CS7 instead of the control signal CS1, as compared with the switch SW3. Therefore, when the switch SW10 is set to the ON-state by the monitor circuit M7, the substrate bias generation circuit VBC supplies the substrate bias voltage VBP to the capacitor C3 via the switch SW10 and a power supply node (third power supply node) N4. On the other hand, when the switch SW10 is turned off by the monitor circuit M7, the substrate bias voltage VBP is not supplied to the capacitor C3 via the switch SW10 and the power supply node N4.

The capacitor C4 is connected to the power supply node N2. The capacitor C4 is disposed between the power supply node N2 and the ground GND. Therefore, the power supply voltage VCC_MCU is supplied to capacitor C2 via the power supply node N2, and capacitor C4 stores the charges based on the power supply voltage VCC_MCU. Capacitor C4 thereby obtains the power supply voltage VCC-MCU. At least, capacitor C4 receives the power supply voltage VSC generated by at least the power generation device P via the power supply node N2, and stores the charges based on the power supply voltage VSC.

Like the control circuit CNT1, the control circuit CNT 2 is connected to the power supply node N2 and has the internal register RE. The control circuit CNT2 is similar to the control circuit CNT1, except that it is controlled based on a reset signal RS2 instead of the reset signal RS1, compared to the control circuit CNT1.

The monitor circuit M7 is connected to the power supply node N2. In other words, the monitor circuit M7 is connected to the power generation device P via the diode D, the power supply node N1, the switch SW8, and the power supply node N2.

The monitor circuit M7 monitors the voltage of the power supply node N2, i.e., the power supply voltage VCC-MCU. The monitor circuit M7 controls the switch SW9, the switch SW10, and the control circuit CNT2 based on the voltages of the power supply node N2. The monitor circuit M7 supplies the control signal CS7 to the switches SW9 and SW10. The monitor circuit M7 also supplies the reset signal RS2 to the control circuit CNT2. The monitor circuit M7 has the threshold voltage (the second threshold voltage) Vst and the threshold voltage (fourth threshold voltage) Vrem. The threshold voltage Vrem is higher than the threshold voltage Vre.

The monitor circuit M7 outputs the control signal CS7 (e.g., High level control signal CS7) when the voltage of power supply node N2 rises and reaches the threshold voltage Vst, and the switches SW9 and SW10 are set from OFF-state to ON-state based on the control signal CS7. The monitor circuit M7 outputs the control signal CS7 (e.g., the low-level control signal CS7) when the voltage of the power supply node N2 drops and the voltage reaches the threshold voltage Vrem, and the switches SW9 and SW10 are set from the ON-state to the OFF-state based on the control signal CS7.

The monitor circuit M7 outputs the reset signal RS2 (e.g., the low-level reset signal RS2) to the control circuit CNT2 when the voltage of the power supply node N2 drops and the voltage reaches the threshold voltage Vrem. As a result, the control circuit CNT2 sets the internal register RE in the control circuit CNT2 and the internal register of the other circuit blocks of the semiconductor device SC4 (e.g., the CPU 10, the memory circuits ME1 and ME2 and the substrate bias generation circuit VBC) to the reset state based on reset signal RS2 (reset operation). The monitor circuit M7 outputs the reset signal RS2 (e.g., High level reset signal RS2) to the control circuit CNT1 when the voltage of the power supply node N2 is higher than the voltage of the threshold voltage Vrem. Consequently, the control circuit CNT2 releases the reset state of each circuit-block based on the reset signal RS2. Thus, if the operating power supply voltage is provided to each circuit block, each circuit block can be activated.

Generally, the substrate bias generation circuit VBC takes longer to start because it uses circuitry with lower current drive capability, such as a charge pump. Therefore, even if the substrate bias generation circuit VBC receives the power supply voltage VCC-MCU via the power supply node N2, the VBC does not start immediately, and may be in an indefinite state. As a result, the substrate bias generation circuit VBC cannot provide the substrate bias voltage VBN and VBP to capacitor C2 and C3, respectively. Furthermore, if the switch SW9 and switch SW10 are set to the ON-state prior to the substrate bias voltage VBN and VBP being supplied to capacitors C2 and C3, respectively, the charge that has accumulated in the capacitors C2 and C3 may escape, as described above.

However, in the starting operation of the electronic system device 4, when the voltage of the power supply node N1 reaches the threshold voltage Vst, the monitor circuit M6 sets the switch SW8 from the OFF-state to the ON-state. Along with this, the substrate bias generation circuit VBC receives the supply voltage VCC_MCU. Thereafter, when the power supply voltage VCC_MCU gradually rises and the voltage of the power supply node N2 reaches the threshold voltage Vst, the monitor circuit M7 sets the switches SW9 and SW10 from the OFF-state to the ON-state.

Therefore, while the substrate bias generation circuit VBC performs the start-up operation based on the power supply voltage VCC MCU, the switches SW9 and SW10 are turned off. In other words, while the switches SW9 and SW10 are in the OFF-state, it is possible to start the substrate bias generation circuit VBC sufficiently to generate the substrate bias voltage VBN and VBP. Thereafter, the switches SW9 and SW10 are set to ON-state, and the substrate bias generation circuit VBC stably supplies the substrate bias voltage VBN and VBP to capacitor C2 and C3, respectively. Therefore, even if the switch SW9 and the switch SW10 are set to the ON-state, since the substrate bias generation circuit VBC operate stably, the charges in capacitor C2 and C3 is hardly pulled out. Consequently, the times for the substrate bias voltage VBN and VBP to reach the threshold voltage VbackN and VbackP are reduced.

In the startup operation of the electronic system device 4, similarly to the startup operation of the electronic system device 1, the consumed current of the semiconductor device SC4 may not be compensated for by the generated current ISC supplied from the power generation device P and the charge charged in capacitor C1.

In the start operation of the electronic system device 4, when the voltages of the power supply nodes N1 and N2 drop and the voltage of the power supply node N2 reaches the threshold voltage Vrem, the monitor circuit M7 sets the switches SW9 and SW10 from the ON-state to the OFF-state. Thereafter, when the voltage of the power supply node N1 further decreases and the voltage of the power supply node N1 reaches the threshold voltage Vre, the monitor circuit M6 sets the switch SW8 from the ON-state to the OFF-state.

If the switch SW9 and the switch SW10 are set to the ON-state after the switch SW8 is set to the OFF-state, the substrate bias generation circuit VBC performs an unstable operation due to the voltage drop of the power supply node N2. At this time, when the substrate bias generation circuit VBC and capacitor C2 and C3 are connected, the charge accumulated in capacitor C2 and C3 escapes as described above.

On the other hand, the electronic system device 4 sets the switches SW9 and SW10 to the OFF-state prior to the substrate bias generation circuit VBC performing an unstable operation due to a drop in the voltage of the power supply node N2. In other words, since the monitor circuit M7 has a higher the threshold voltage Vrem than the threshold voltage Vre of the monitor circuit M6, the switches SW9 and SW10 are set to the OFF-state prior to the switch SW8 being set to the OFF-state. Therefore, capacitor C2 and C3 are cut off from the substrate bias generation circuit VBC and can stably store the accumulated charges. Consequently, the times for the substrate bias voltage VBN and VBP to reach the threshold voltage VbackN and VbackP are reduced.

Thus, the substrate bias generation circuit VBC of the electronic system device 4 can provide the back bias voltage VNS and VPS to the CPU 10, the memory circuit ME1, the memory circuit ME2 as soon as possible. Therefore, the electronic system device 4 can stably execute the startup sequence and complete the startup sequence.

Like the start operation of the electronic system device 1, the start operation of the electronic system device 4 includes the above-described the first step, the second step, the third step, and the fourth step. Further, even if the operation shifts to the reset operation during the start-up operation of the electronic system device 4, since capacitor C2 and C3 retain the charges in the same manner as the electronic system device 1, the start-up sequence can be stably completed by repeatedly executing the drive operation and the reset operation a plurality of times.

What is claimed is:
1. An electronic system device comprising:
a power generation device generating a first power supply voltage and supplying the first power supply voltage to a first power supply node;

a substrate bias generation circuit connected to the power generation device via the first power supply node and generating a substrate bias voltage based on the first power supply voltage;

a first memory circuit connected to the power generation device via the first power supply node and configured with field effect transistors;

a first control switch connected to the substrate bias generation circuit;

a first capacitor connected to the first control switch via a second power supply node and receiving the substrate bias voltage from the substrate bias generation circuit; and a power supply monitor circuit connected to the first power supply node and controlling the first control switch based on voltage of the first power supply node, wherein, while the power supply monitor circuit is setting the first control switch to an ON-state, the substrate bias generation circuit accumulates charges based on the substrate bias voltage into the first capacitor, wherein the first capacitor hold the accumulated charges, while the power supply monitor circuit is setting the first control switch to an OFF-state, wherein, while the power supply monitor circuit is setting the first control switch to the ON-state, the substrate bias generation circuit adds the charges based on the substrate bias voltage to the held charges to obtain a back bias voltage by the added charges, and wherein the substrate bias generation circuit supplies the back bias voltage to a well region of the field effect transistors.

2. The electronic system device according to claim 1, wherein the field effect transistors are SOTB transistors, and wherein the SOTB transistors includes:
 a substrate;
 a well region formed on the substrate;
 a semiconductive layer formed through an insulating film on the well region;
 a source region, a drain region, and a channel region formed in the semiconductive layer; and
 a gate electrode disposed on the channel region via a gate insulating film.

3. The electronic system device according to claim 2, further comprising:

a substrate bias monitor circuit connected to the second power supply node, and controlling the substrate bias generation circuit based on the voltage of the second power supply node, wherein the substrate bias monitor circuit has a first threshold voltage, wherein when the voltage of the second power supply node reaches the first threshold voltage by the added charges, the substrate bias monitor circuit supplies a control signal to the substrate bias generation circuit, and wherein the substrate bias generation circuit supplies the back bias voltage to the well region of the field effect transistors based on the control signal.

4. The electronic system device according to claim 3, further comprising:

a power switch connected to the power generation device via the first power supply node, wherein the substrate bias generation circuit is connected to the first power supply node via the power switch, wherein the power supply monitor circuit controls the power switch and the control switch based on the voltage of the first power supply node, and has a second threshold voltage and a third threshold voltage, wherein when the voltage of the first power supply node reaches the second threshold voltage, the power supply monitor circuit sets the power switch and the control switch from an OFF-state to an ON-state, and wherein when the voltage of the first power supply node reaches the third threshold voltage, the power supply monitor circuit sets the power switch and the control switch from an ON-state to an OFF-state.

5. The electronic system device according to claim 4, further comprising:

a control circuit connected to the first power supply node via the power switch and including an internal register;

a central processing unit connected to the first power supply node via the power switch; and a second memory circuit connected to the first power supply node via the power switch and storing a user program and an initial value, wherein while the power supply monitor circuit is setting the power switch to ON-state, the control circuit reads the initial value from the second memory circuit and sets the initial value to the internal register, wherein after the initial value is set to the internal register, the central processing unit reads the user program from the second memory circuit and executes the user program, wherein the central processing unit supplies a specification signal to the control circuit in accordance with the user program, wherein the control circuit supplies a mode specification signal to the substrate bias generation circuit based on the specification signal, and wherein the substrate bias generation circuit generates the substrate bias voltage from the first power supply voltage based on the mode specification signal.

6. The electronic system device according to claim 5, wherein when the voltage of the first power supply node reaches the third threshold voltage, the power supply monitor circuit supplies a reset signal to the control circuit, and wherein the control circuit sets the internal register to a reset state based on the reset signal.

7. The electronic system device according to claim 6, further comprising:

a second capacitor connected to the first power supply node in parallel with the power switch, wherein the second capacitor stores the charges based on the first power supply voltage.

8. The electronic system device according to claim 4, wherein power supply monitor circuit receives an external mode signal and changes a value of the second threshold voltage based on the external mode signal.

9. The electronic system device according to claim 4, wherein the second threshold voltage is higher than the third threshold voltage.

10. An electronic system device comprising:

a power generation device generating a first power supply voltage and supplying the first power supply voltage to a first power supply node;

a power switch connected to the power generation device via the first power supply node;

a substrate bias generation circuit connected to the power switch via a second power supply node and generating a substrate bias voltage based on the first power supply voltage;

a memory circuit connected to the second power supply node and configured with SOTB transistors;

a control switch connected to the substrate bias generation circuit;

a first capacitor connected to the control switch via a third power supply node and receiving the substrate bias voltage from the substrate bias generation circuit;

a first power supply monitor circuit connected to the first power supply node and controlling the power switch based on a voltage of the first power supply node; and a second power supply monitor circuit connected to the second power supply node, and controlling the control switch based on a voltage of the second power supply node, wherein, while the second power supply monitor circuit is setting the control switch to an ON-state, the substrate bias generation circuit accumulates charges to the first capacitor based on the substrate bias voltage, wherein while the second power supply monitor circuit is setting the control switch to an OFF-state, the first capacitor holds the accumulated charges, wherein while the second power supply monitor circuit is setting the control switch to the ON-state, the held charges are added to the charges based on the substrate bias voltage to obtain a back bias voltage by the added charges, and wherein the substrate bias generation circuit supplies the back bias voltage to a well region of the SOTB transistors.

11. The electronic system device according to claim 10, further comprising:

a substrate bias monitor circuit connected to the third power supply node, and controlling the substrate bias generation circuit based on the voltage of the third power supply node, wherein the substrate bias monitor circuit has a first threshold voltage, wherein, when the substrate bias monitor circuit monitors the voltage of the third power supply node and when the voltage of the third power supply node reaches the first threshold voltage by the added charges, the substrate bias monitor circuit supplies a control signal to the substrate bias generation circuit, and wherein the substrate bias generation circuit supplies the back bias voltage to the well region of the SOTB transistors based on the control signal.

12. The electronic system device according to claim 11, wherein the first power supply monitor circuit and the second power supply monitor circuit have a second threshold voltage, wherein when the voltage of the first power supply node reaches the second threshold voltage, the first power supply monitor circuit sets the power switch from an OFF-state to an ON-state, and wherein, after the power switch is set from the OFF-state to the ON-state, when the voltage of the second power supply node reaches the second threshold voltage, the second power supply monitor circuit sets the control switch from the OFF-state to the ON-state.

13. The electronic system device according to claim 12, wherein the first power supply monitor circuit has a third threshold voltage, wherein the second power supply monitor circuit has a fourth threshold voltage higher than the third threshold voltage, wherein when the voltage of the second power supply node reaches the fourth threshold voltage, the second power supply monitor circuit sets the control switch from the ON-state to the OFF-state, and wherein, after the control switch is set from the ON-state to the OFF-state, when the voltage of first power supply node reaches the third threshold voltage, the first power supply monitor circuit sets the power switch from the ON-state to the OFF-state.

14. The electronic system device according to claim 13, wherein the SOTB transistors comprises:

a substrate;

a well region formed on the substrate;

a semiconductive layer formed through an insulating film on the well region, a source region, drain region, and channel region formed in the semiconductive layer; and a gate electrode disposed on the channel region via a gate insulating film.

15. The electronic system device according to claim 14, further comprising:

a second capacitor connected to the first power supply node in parallel with the power switch, wherein the second capacitor accumulates the charges based on the first power supply voltage.

16. A starting method of an electronic system device, the electronic system device comprising:

a power generation device generating a first power supply voltage and supplying the first power supply voltage to a first power supply node;

a substrate bias generation circuit connected to the power generation device via the first power supply node and generating a first substrate bias voltage based on the first power supply voltage;

a memory circuit connected to the power generation device via the first power supply node and including n-type SOTB transistors;

a first control switch connected to the substrate bias generation circuit;

a first capacitor connected to the first control switch via a second power supply node and receiving the first substrate bias voltage from the substrate bias generation circuit; and a power supply monitor circuit connected to the first power supply node and controlling the first control switch based on the first power supply node voltages, wherein the starting method comprising the step of:

(a) accumulating charges based on first substrate bias voltage to first capacitor by the substrate bias generation circuit, while the power supply monitor circuit is setting the first control switch to an ON-state, (b) after step (a), holding the charges accumulated by step (a) in the first capacitor, while the power supply monitor circuit sets the first control switch to an OFF-state, (c) after step (b), adding the charges based on the first substrate bias voltage to the charges held by step (b) in the substrate bias generation circuit, and obtaining a first back bias voltage based on the added charges, while the power supply monitor circuit is setting the first control switch to the ON-state, (d) supplying the first back bias voltage to a well region of the n-type SOTB transistors by the substrate bias generation circuit.

17. The starting method according to claim 16, wherein the substrate bias generation circuit generates a second substrate bias voltage that differs from the first substrate bias voltage based on the first power supply voltage, and wherein the memory circuit further comprises p-type SOTB transistors.

18. The starting method according to claim 17,
wherein the electronic system device further comprising:
a second control switch connected to the substrate bias generation circuit; and
a second capacitor connected to the second control switch via a third power supply node and receiving the second substrate bias voltage from the substrate bias generation circuit,
wherein the power supply monitor circuit controls the first control switch and the second control switch based on the voltage of the first power supply node,
wherein, in the step of (a), while the power supply monitor circuit is setting the second control switch to the ON-state, the substrate bias generation circuit accumulates charges based on the second substrate bias voltage in the second capacitor,
wherein, in the step of (b), while the power supply monitor circuit is setting the second control switch to the OFF-state, the second capacitor retains the accumulated charges,
wherein, in the step of (c), while the power supply monitor circuit is setting the second control switch to the ON-state, the substrate bias generation circuit adds the charges based on the second substrate bias voltage to the charges in the second capacitor, and obtains a second back bias voltage by the added charges, and
wherein, in the step of (d), the substrate bias generation circuit supplies the second back bias voltage to a well region of the p-type SOTB transistors.

19. The starting method according to claim 18,
wherein the electronic system device further comprising a power switch connected to the power generation device via the first power supply node,
wherein the substrate bias generation circuit is connected to the first power supply node via the power switch,
wherein the memory circuit is connected to the first power supply node via the power switch,
wherein the power supply monitor circuit has a first threshold voltage and a second threshold voltage,
wherein, when the voltage of the first power supply node reaches the first threshold voltage, the power supply monitor circuit sets the power switch, the first control switch, and the second control switch from the OFF-state to the ON-state, and
wherein, when the voltage of the first power supply node reaches the second threshold voltage, the power supply monitor circuit sets the power switch, the first control switch, and the second control switch from the ON-state to the OFF-state.

20. The starting method according to claim 19, wherein the first threshold voltage is higher than the second threshold voltage.

* * * * *